US012642105B2

(12) United States Patent　　(10) Patent No.:　US 12,642,105 B2

Tanabiki et al.　　　　　　　　　 (45) Date of Patent:　　May 26, 2026

(54) SEMICONDUCTOR DEVICE

(71) Applicants: Kabushiki Kaisha Toshiba, Tokyo
(JP); **Toshiba Electronic Devices &
Storage Corporation**, Tokyo (JP)

(72) Inventors: Kyo Tanabiki, Himeji Hyogo (JP);
Yoshihiro Higashikawa, Tokyo (JP);
Hajime Takagi, Nonoichi Ishikawa (JP)

(73) Assignees: Kabushiki Kaisha Toshiba, Kawasaki
(JP); **Toshiba Electronic Devices &
Storage Corporation**, Kawasaki (JP)

( * ) Notice: Subject to any disclaimer, the term of this
patent is extended or adjusted under 35
U.S.C. 154(b) by 509 days.

(21) Appl. No.: 18/104,554

(22) Filed: Feb. 1, 2023

(65) Prior Publication Data

US 2024/0096762 A1　　Mar. 21, 2024

(30) Foreign Application Priority Data

Sep. 16, 2022　(JP) ................................ 2022-148132

(51) Int. Cl.
H01L 23/495　　　(2006.01)
H01L 23/31　　　　(2006.01)
(Continued)

(52) U.S. Cl.
CPC ......... H10W 70/424 (2026.01); H10W 20/20
(2026.01); H10W 74/114 (2026.01); **H10W
90/811** (2026.01)

(58) Field of Classification Search
CPC ... H01L 23/00–49548; H01L 23/49551; H01L
25/072
See application file for complete search history.

(56) References Cited

U.S. PATENT DOCUMENTS 6,081,031 A　　6/2000　Letterman, Jr
8,497,572 B2 *　7/2013　Fukutani ........... H01L 23/49575
257/E23.079

(Continued)

FOREIGN PATENT DOCUMENTS

JP　　　2002100716 A　　4/2002
JP　　　2010-258366 A　　11/2010
(Continued)

OTHER PUBLICATIONS

Japanese Office Action mailed Jul. 29, 2025 in corresponding
Japanese Patent Application 2022-148132 with English Translation,
10 pages.

*Primary Examiner* — Monica D Harrison
*Assistant Examiner* — Jacob T Nelson
(74) *Attorney, Agent, or Firm* — Kim & Stewart LLP

(57)　　　　　　ABSTRACT

A first chip on a first lead frame includes a first source
electrode on a surface opposite to the first lead frame. A first
source terminal is located in a first direction from the first
lead frame. A first gate terminal is located in a second
direction from the first source terminal. A first conductor
contacts the first source electrode and the first source ter-
minal via conductors. A second chip on a second lead frame
includes a second source electrode on a surface opposite to
the second lead frame. A second gate terminal is located in
a second direction from the first gate terminal. A second
source terminal is located in the second direction from the
second gate terminal. A second conductor contacts the
second source electrode and the second source terminal via
conductors.

18 Claims, 18 Drawing Sheets

(51) Int. Cl.
| | |
|---|---|
| *H01L 25/07* | (2006.01) |
| *H10W 20/20* | (2026.01) |
| *H10W 70/40* | (2026.01) |
| *H10W 74/10* | (2026.01) |
| *H10W 90/00* | (2026.01) |

(56)         References Cited

U.S. PATENT DOCUMENTS

| | | | | |
|---|---|---|---|---|
| 9,472,538 | B2 | 10/2016 | Inokuchi et al. | |
| 2002/0033541 | A1 | 3/2002 | Uchida | |
| 2010/0270992 | A1 | 10/2010 | Kawashima et al. | |
| 2013/0207256 | A1* | 8/2013 | Uno | H01L 21/50 |
| | | | | 438/106 |
| 2017/0194294 | A1 | 7/2017 | Yanagida | |
| 2019/0139866 | A1* | 5/2019 | Kuraya | H01L 24/29 |
| 2020/0286866 | A1 | 9/2020 | Kawashima | |
| 2021/0104453 | A1* | 4/2021 | Kinoshita | H01L 24/49 |
| 2022/0115307 | A1 | 4/2022 | Igoshi | |
| 2024/0079383 | A1 | 3/2024 | Kawashima | |

FOREIGN PATENT DOCUMENTS

| | | | |
|---|---|---|---|
| JP | 2012-015453 | A | 1/2013 |
| JP | 2013-149684 | A | 8/2013 |
| JP | 2017123386 | A | 7/2017 |
| JP | 2020013955 | A | 1/2020 |
| JP | 2020-035831 | A | 3/2020 |
| JP | 2020145285 | A | 9/2020 |
| JP | 2021015856 | A | 2/2021 |
| JP | 2022191918 | A | 12/2022 |
| WO | 2015/001648 | A1 | 1/2015 |

* cited by examiner

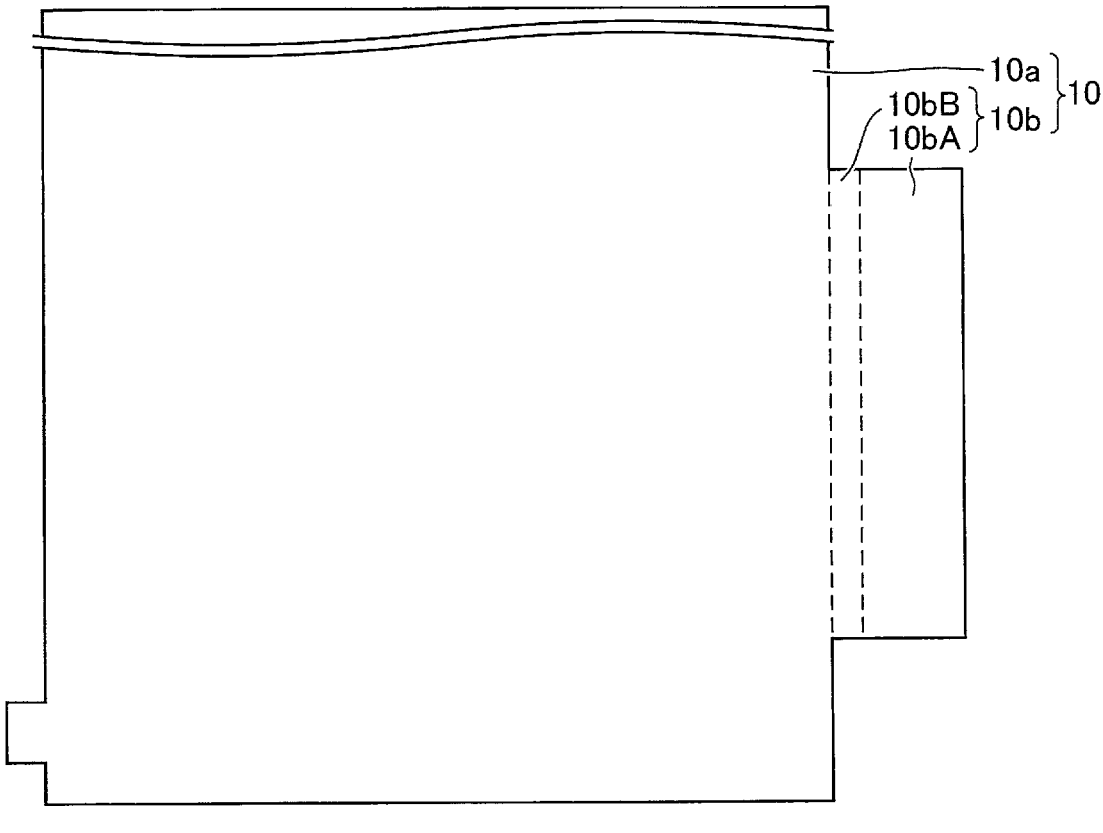
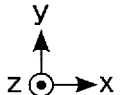
F I G. 3

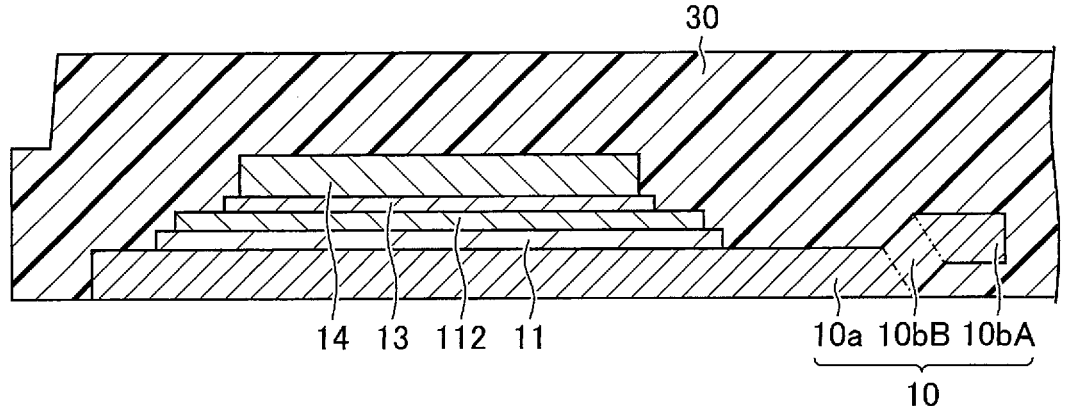
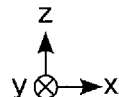
F I G. 4

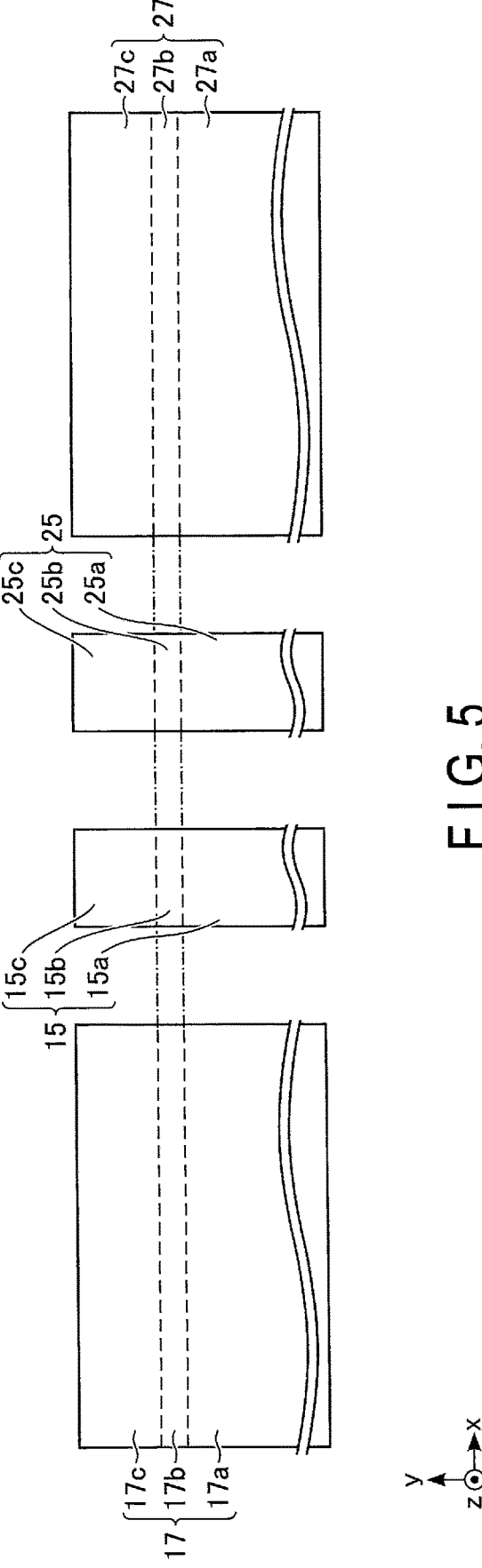
F I G. 5

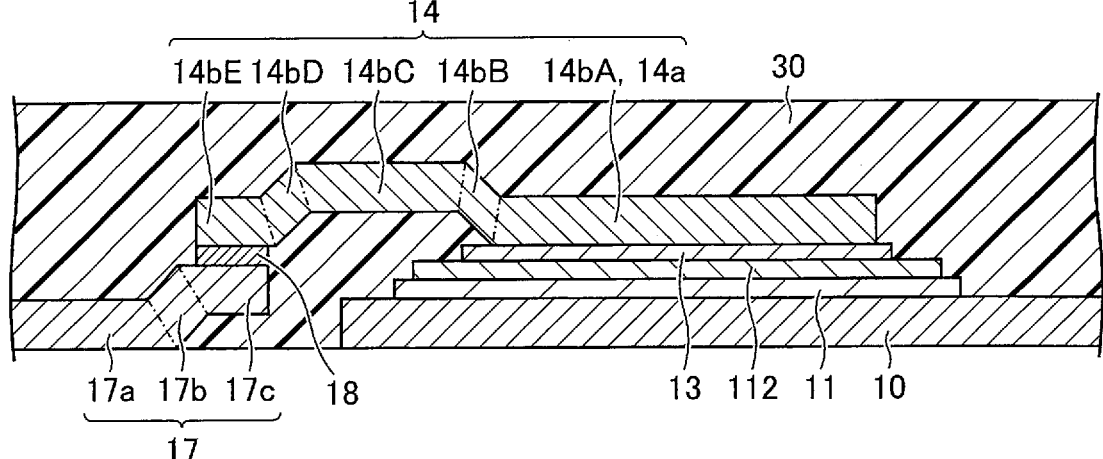
F I G. 7

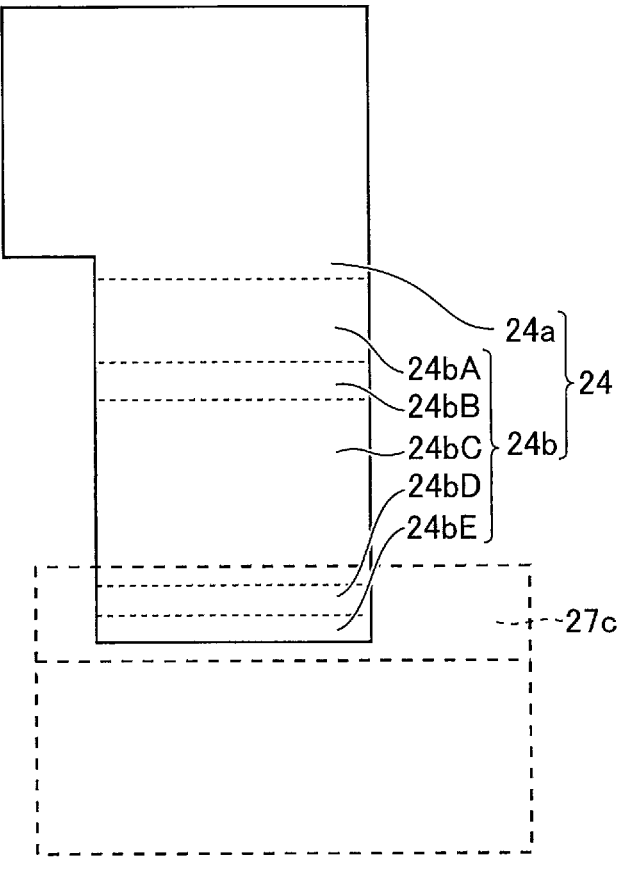
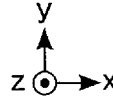
F I G. 8

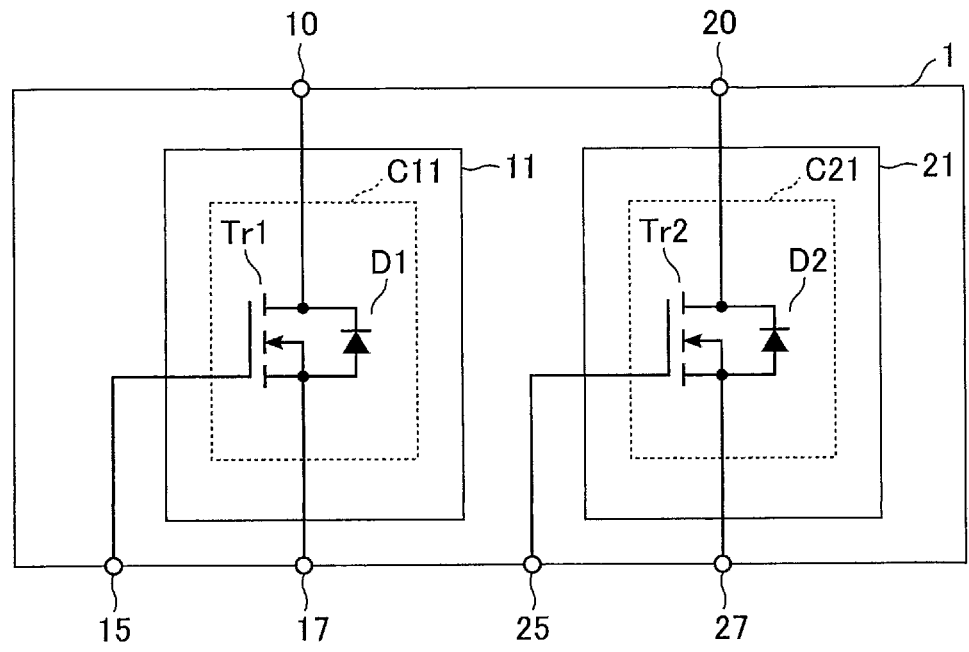
F I G. 10

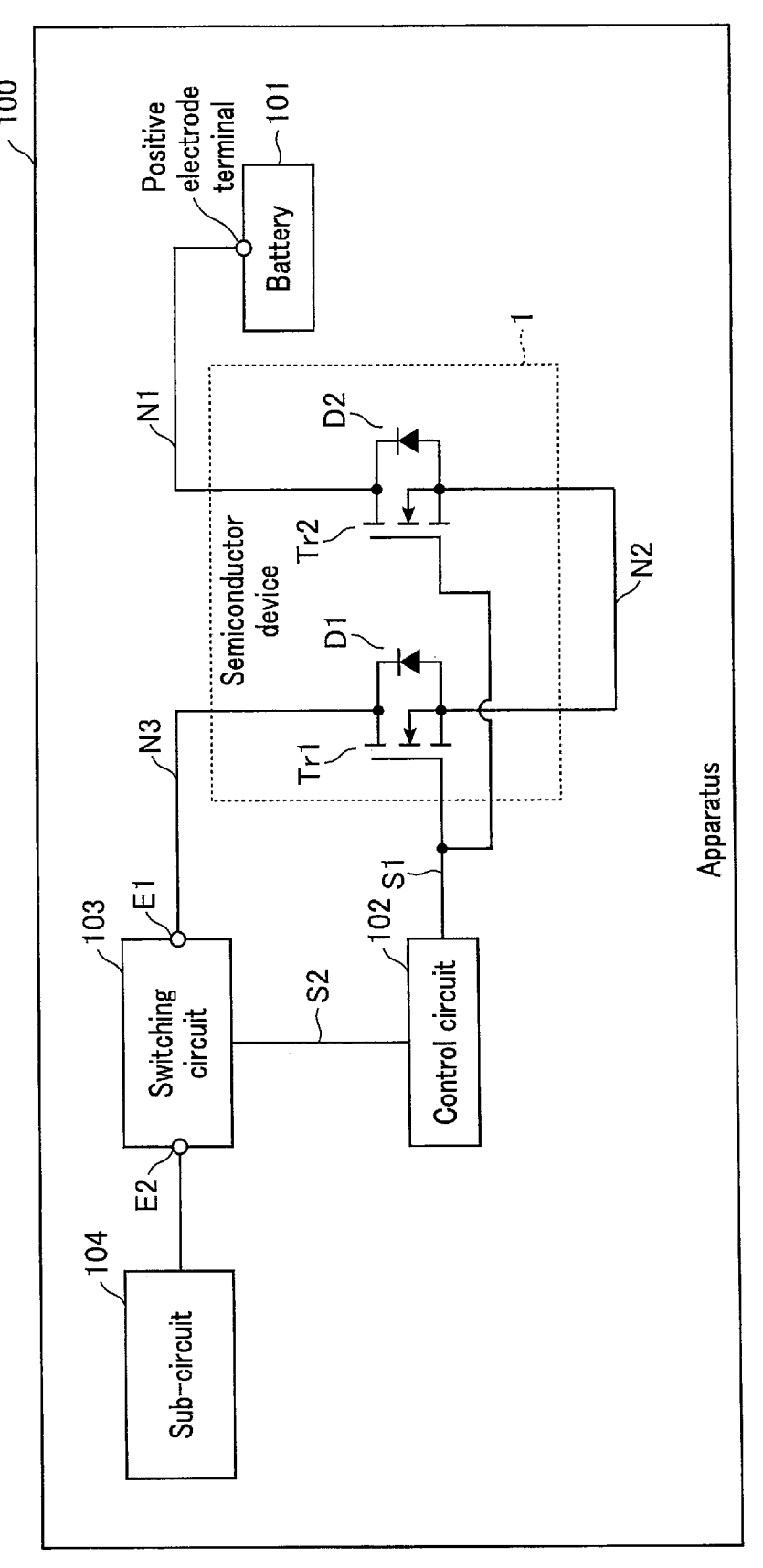
F I G. 11

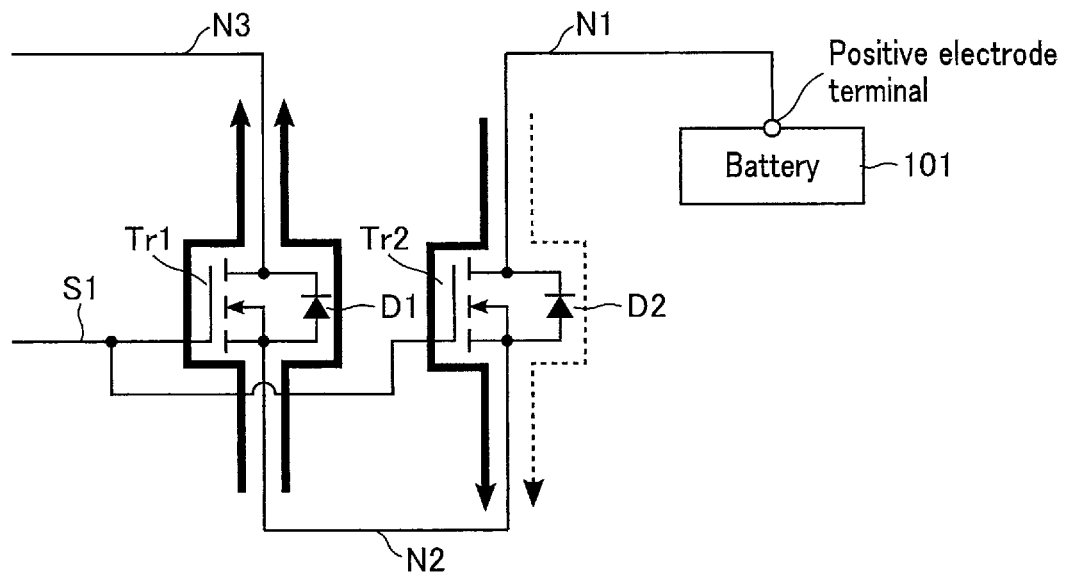
F I G. 13

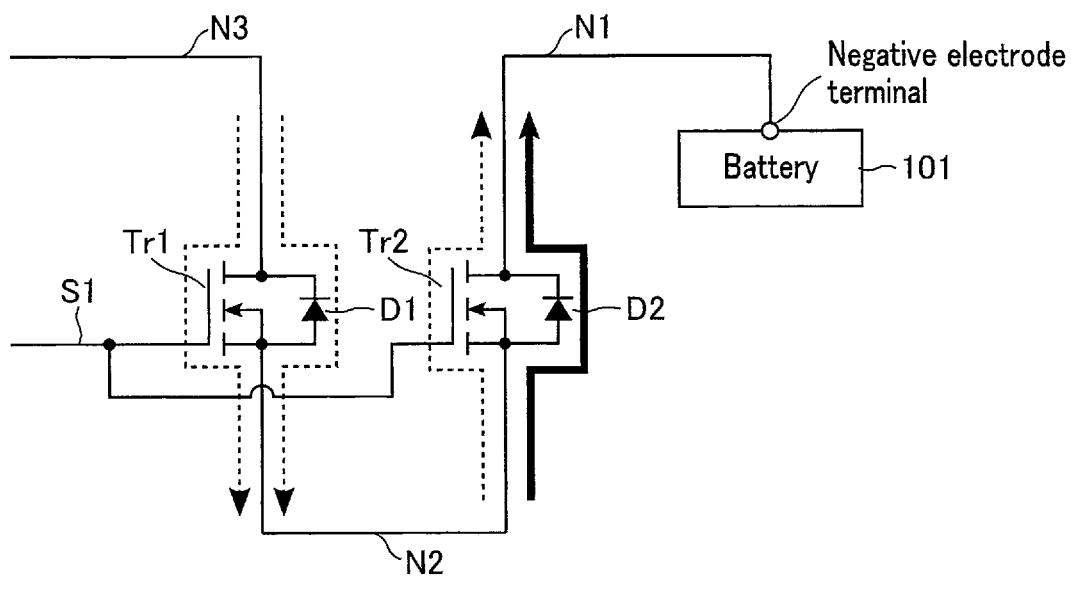
F I G. 14

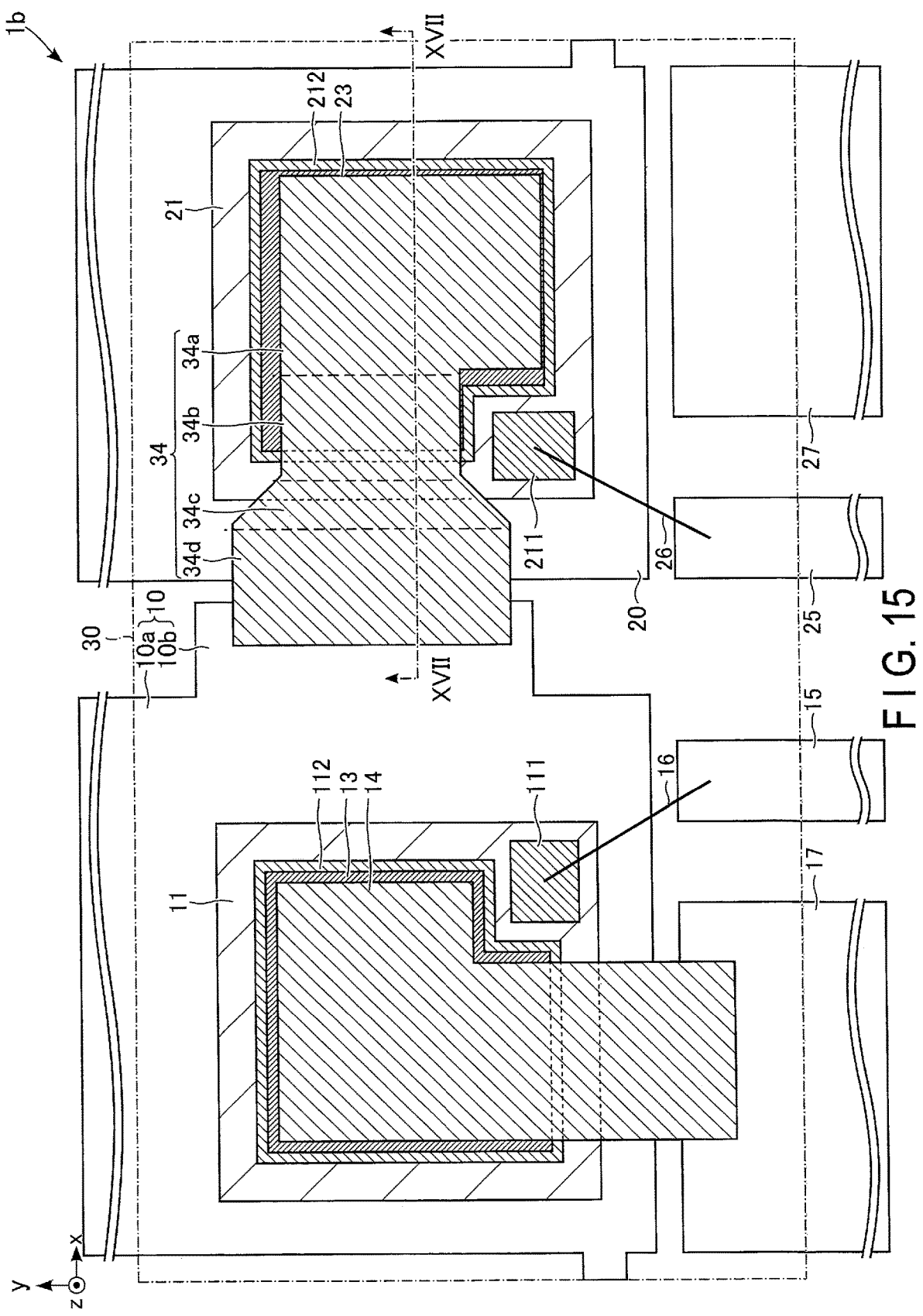
F I G. 15

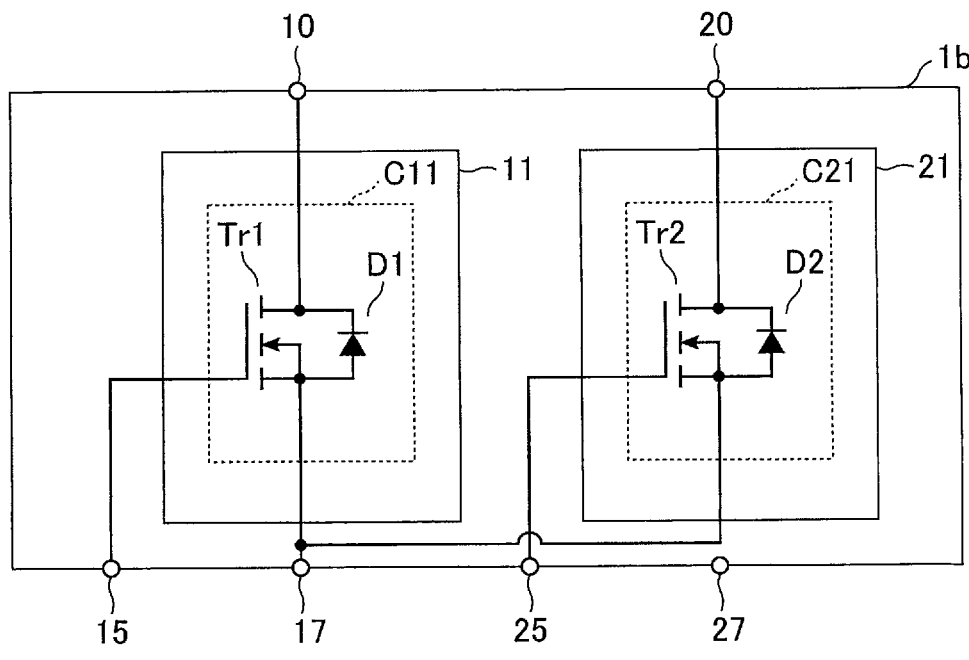
F I G. 18

SEMICONDUCTOR DEVICE

CROSS-REFERENCE TO RELATED APPLICATION(S)

This application is based upon and claims the benefit of priority from Japanese Patent Application No. 2022-148132, filed Sep. 16, 2022, the entire contents of which are incorporated herein by reference.

FIELD

Embodiments described herein relate generally to a semiconductor device.

BACKGROUND

A semiconductor device including a semiconductor chip, a lead frame, and a resin sealing the semiconductor chip and the lead frame is known.

BRIEF DESCRIPTION OF THE DRAWINGS

FIG. 3 shows, along a given x-y plane, a structure of a lead frame of the semiconductor device according to the first embodiment.

FIG. 4 shows a structure of a part of the semiconductor device according to the first embodiment, taken along a given x-z plane.

FIG. 5 shows, along a given x-y plane, a structure of connection terminals of the semiconductor device according to the first embodiment.

FIG. 7 shows a structure of a part of the semiconductor device according to the first embodiment, taken along a given x-z plane.

FIG. 8 shows, along a given x-y plane, a structure of a connector of the semiconductor device according to the first embodiment.

FIG. 10 shows a circuit realized by the semiconductor device according to the first embodiment.

FIG. 11 shows a circuit in an exemplary application of the semiconductor device according to the first embodiment.

FIG. 13 shows currents flowing in the semiconductor device according to the first embodiment under a normal state.

FIG. 14 shows a current that would flow in the semiconductor device according to the first embodiment under an abnormal state.

FIG. 15 shows, along a given x-y plane, a structure of a semiconductor device according to a first modification of the first embodiment.

FIG. 18 shows a circuit realized by the semiconductor device according to the first modification of the first embodiment.

DETAILED DESCRIPTION

Figure 1:
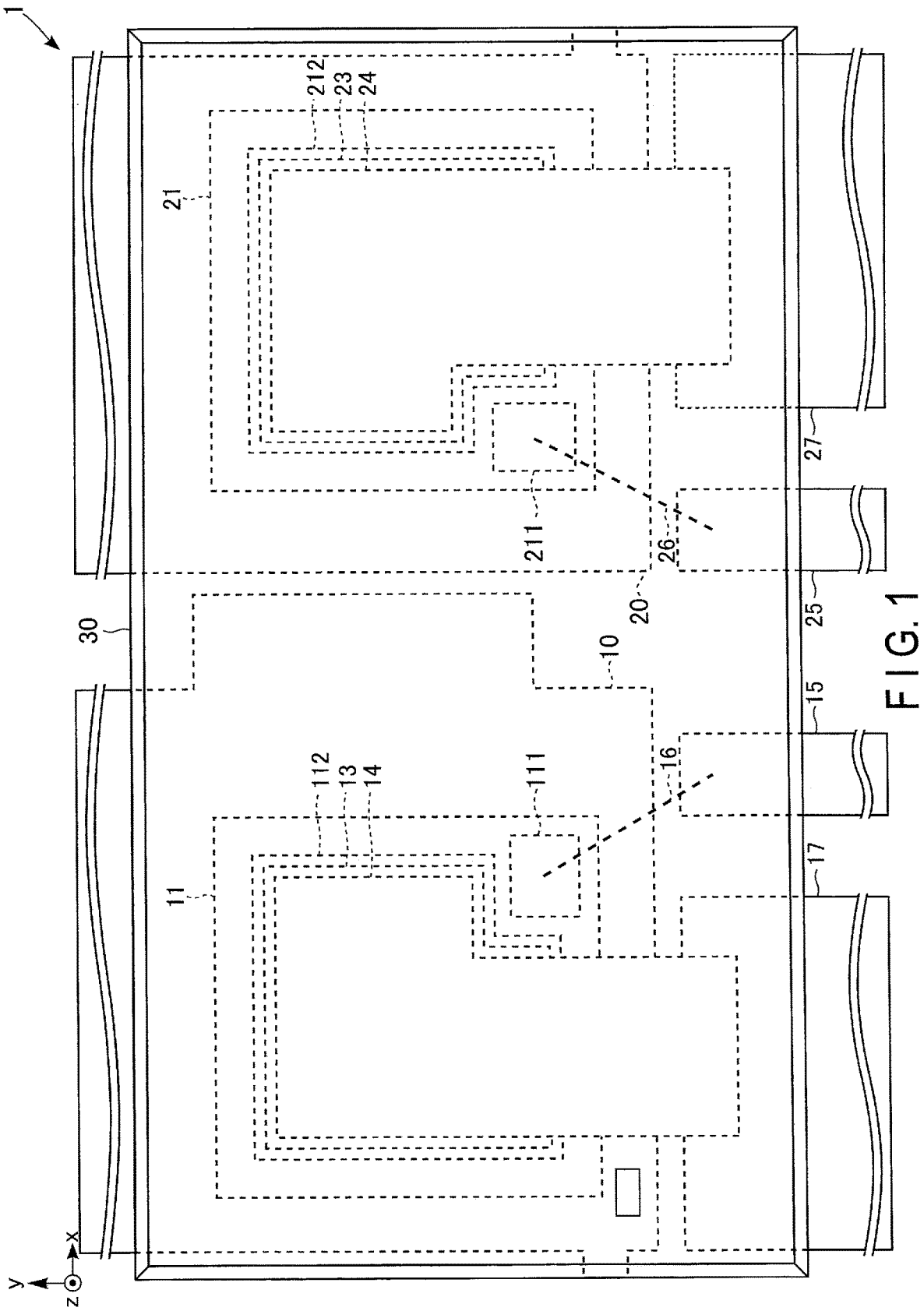
FIG. 1 shows, along a given x-y plane, a structure of a semiconductor device according to a first embodiment.

In general, according to one embodiment, a semiconductor device includes a first lead frame, a first semiconductor chip, a first source terminal, a first gate terminal, a first conductor, a second lead frame, a second semiconductor chip, a second gate terminal, a second source terminal, and a second conductor. The first semiconductor chip is in contact with the first lead frame, includes a first transistor, and includes a first gate electrode and a first source electrode on a surface opposite to the first lead frame. The first gate electrode is coupled to a gate of the first transistor. The first source electrode is coupled to a source of the first transistor. The first source terminal is located in a first direction from the first lead frame. The first gate terminal is located in a second direction from the first source terminal and electrically coupled to the first gate electrode. The second direction crosses the first direction. The first conductor is in contact with the first source electrode via a conductor and in contact with the first source terminal via a conductor. The second lead frame is located in the second direction from the first lead frame. The second semiconductor chip is in contact with the second lead frame, includes a second transistor, and includes a second gate electrode and a second source electrode on a surface opposite to the second lead frame. The second gate electrode is coupled to a gate of the second transistor. The second source electrode is coupled to a source of the second transistor. The second gate terminal is located in the second direction from the first gate terminal and electrically coupled to the second gate electrode. The second source terminal is located in the second direction from the second gate terminal. The second conductor is in contact with the second source electrode via a conductor and in contact with the second source terminal via a conductor.

Embodiments will now be described with reference to the figures. The figures are schematic, and the relationship between the thickness and the area of a plane of a layer and the ratio of thicknesses of layers may differ from those in actuality. The figures may include components which differ in relations and/or ratios of dimensions in different figures.

The embodiments will be described using an x-y-z orthogonal coordinate system. A positive direction along the vertical axis of each figure may be referred to as "up", "above", "upper side", or the like, and a negative direction along the vertical axis of each figure may be referred to as "down", "below", "lower side", or the like. A positive direction along the horizontal axis of each figure may be referred to as "right", "right side", or the like, and a negative direction along the horizontal axis of each figure may be referred to as "left", "left side", or the like. In other words, supposing that a figure shows an object along an x-y plane, an upper side represents a +y direction, a lower side represents a −y direction, a right side represents a +x direction, and a left side represents a −x direction. Supposing that a figure shows an object along an x-z plane, an upper side represents a +z direction, a lower side represents a −z direction, a right side represents a +x direction, and a left side represents a −x direction.

1. First Embodiment

Figure 2:
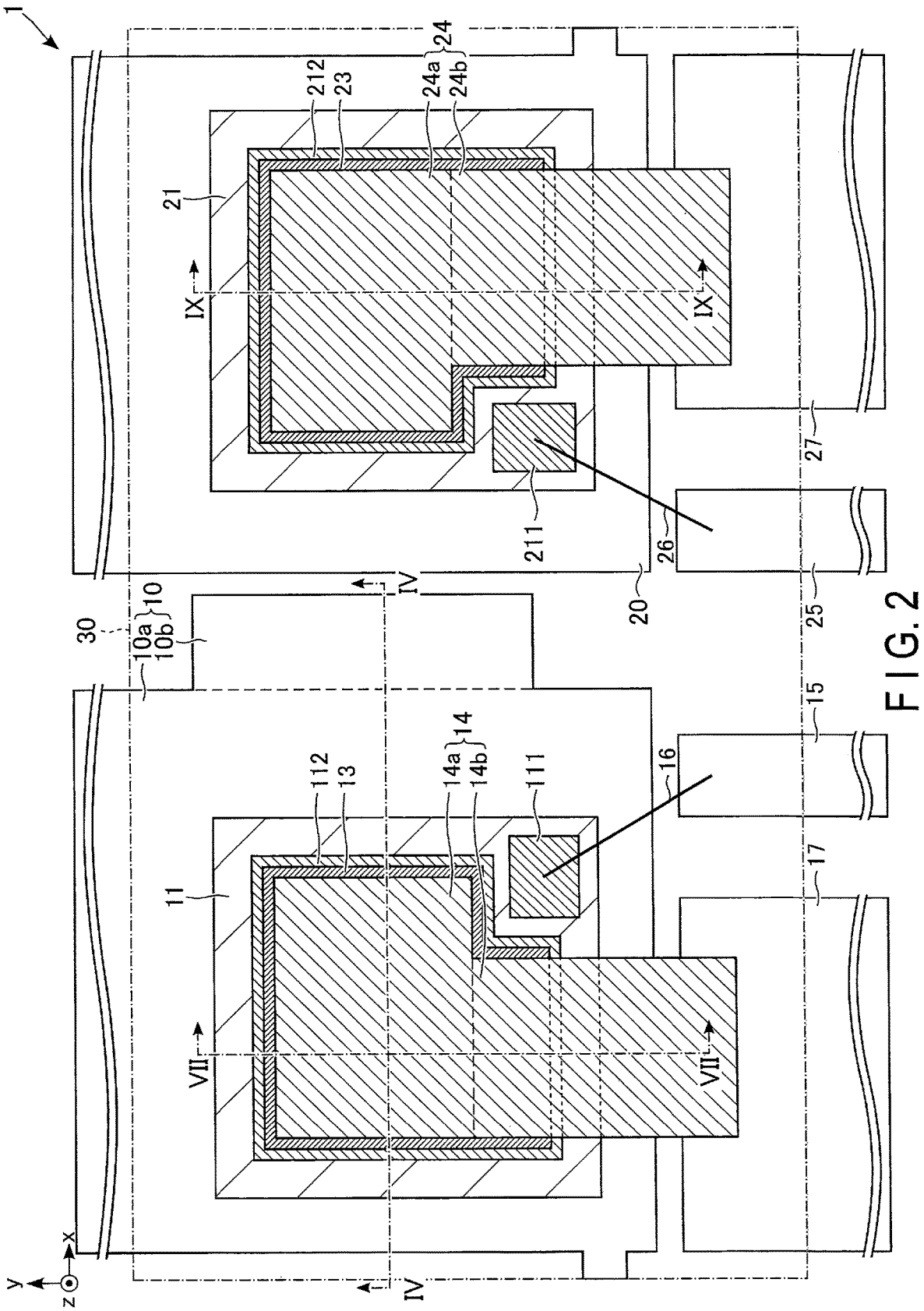
FIG. 2 shows, along a given x-y plane, the structure of the semiconductor device according to the first embodiment.

FIG. 1 and FIG. 2 show a structure of a semiconductor device 1 according to the first embodiment along given x-y planes. The semiconductor device 1 in FIG. 1 and FIG. 2 is given as a top view, that is, in a state of being observed from the +z direction side. FIG. 1 uses solid lines to indicate the exterior of the semiconductor device 1, and uses broken lines to indicate components disposed within the semiconductor device 1. FIG. 2 uses solid lines to indicate components disposed within the semiconductor device 1, and uses dashed-dotted lines to indicate the exterior of the semiconductor device 1. In drawings other than cross-sectional views (including FIG. 2), hatching may be added to components so that the drawings become visually easier to comprehend. Hatching does not specify or limit the materials of hatched components.

As shown in FIG. 1, the semiconductor device 1 includes a lead frame 10, a semiconductor chip 11, a connection member 13, a connector 14, a gate terminal 15, an interconnect 16, a source terminal 17, a lead frame 20, a semiconductor chip 21, a connection member 23, a connector 24, a gate terminal 25, an interconnect 26, a source terminal 27, and a sealing resin 30.

The sealing resin 30 is a component for sealing the whole or a part of more than one component of the semiconductor device 1. The sealing resin 30 has a quadrilateral shape, e.g., a rectangular shape, along an x-y plane. In one example, the sealing resin 30 covers a part of the lead frame 10, an entirety of the semiconductor chip 11, an entirety of the connection member 13, an entirety of the connector 14, a part of the gate terminal 15, an entirety of the interconnect 16, a part of the source terminal 17, a part of the lead frame 20, an entirety of the semiconductor chip 21, an entirety of the connection member 23, an entirety of the connector 24, a part of the gate terminal 25, an entirety of the interconnect 26, and a part of the source terminal 27. That is, these component portions, i.e., the part of the lead frame 10, the entirety of the semiconductor chip 11, the entirety of the connection member 13, the entirety of the connector 14, the part of the gate terminal 15, the entirety of the interconnect 16, the part of the source terminal 17, the part of the lead frame 20, the entirety of the semiconductor chip 21, the entirety of the connection member 23, the entirety of the connector 24, the part of the gate terminal 25, the entirety of the interconnect 26, and the part of the source terminal 27, are located inside the sealing resin 30. The remaining part of the lead frame 10, the remaining part of the gate terminal 15, the remaining part of the source terminal 17, the remaining part of the lead frame 20, the remaining part of the gate terminal 25, and the remaining part of the source terminal 27 are exposed from the sealing resin 30. The sealing resin 30 is, for example, an epoxy resin.

As shown in FIG. 2, the lead frame 10 extends over an x-y plane. The lead frame 10 is a conductor supporting the semiconductor chip 11. The shape of the lead frame 10 is, for example, a plate-like shape. The lead frame 10 contains metal or is constituted by metal.

In one example, the lead frame 10 is located in the left part of the semiconductor device 1 and faces the left side of the semiconductor device 1. The lead frame 10 includes a first portion 10a and a second portion 10b. For example, the first portion 10a has a quadrilateral shape, which may be a rectangular shape, except that a predetermined projection is present at its left part. The first portion 10a extends over an x-y plane. The first portion 10a has an upper side extending along the upper side of the sealing resin 30. A part of the first portion 10a that includes the upper side of the first portion 10a is exposed from the sealing resin 30. The remaining part of the first portion 10a is located within the sealing resin 30.

The second portion 10b is located to the right of the first portion 10a. The second portion 10b is, via its left side, connected to the right side of the first portion 10a. For example, the second portion 10b has a quadrilateral shape, which may be a rectangular shape. The size of the second portion 10b along the y axis is, for example, smaller than the size of the first portion 10a along the y axis. The midpoint of the left side of the second portion 10b along the y axis is located at or near the midpoint of the right side of the first portion 10a along the y axis.

The gate terminal 15 serves as a terminal for electrically coupling the semiconductor device 1 with one or more external conductors. In one example, the gate terminal 15 extends over an x-y plane. The gate terminal 15 and the first portion 10a of the lead frame 10 are arranged along the y axis. The gate terminal 15 is located below the first portion 10a of the lead frame 10. The gate terminal 15 is at a distance from the lead frame 10. A part of the gate terminal 15 that includes the lower side of the gate terminal 15 is exposed from the sealing resin 30. The gate terminal 15 has an upper side extending along the lower side of the first portion 10a of the lead frame 10. The gate terminal 15 has, for example, a quadrilateral shape, which may be a rectangular shape, along an x-y plane.

The source terminal 17 serves as a terminal for electrically coupling the semiconductor device 1 with one or more external conductors. In one example, the source terminal 17 extends over an x-y plane. The source terminal 17 and the first portion 10a of the lead frame 10 are arranged along the y axis. The source terminal 17 is located below the first portion 10a of the lead frame 10. The source terminal 17 is at a distance from the lead frame 10. The source terminal 17 and the gate terminal 15 are arranged along the x axis. The source terminal 17 is located to the left of the gate terminal 15. A part of the source terminal 17 that includes the lower side of the source terminal 17 is exposed from the sealing resin 30. The source terminal 17 has an upper side extending along the lower side of the first portion 10a of the lead frame 10. The source terminal 17 has, for example, a quadrilateral shape, which may be a rectangular shape, along an x-y plane. The size of the source terminal 17 along the x axis is, for example, larger than the size of the gate terminal 15 along the x axis.

The semiconductor chip 11 includes an integrated circuit (IC) constituted by circuitry elements formed with semiconductors. In one example, the semiconductor chip 11 includes elements such as a transistor Tr1 and a diode D1 coupled in parallel with the transistor Tr1 (neither element is illustrated in the figure). The semiconductor chip 11 has, for example, a quadrilateral shape, which may be a rectangular shape, along an x-y plane. The semiconductor chip 11 in its entirety overlaps the first portion 10a of the lead frame 10 along an x-y plane. The center of the semiconductor chip 11 based on the shape along a given x-y plane is located, for example, at or near the center of the first portion 10a of the lead frame 10 based on the shape along the x-y plane. The semiconductor chip 11 is located on the surface of the first portion 10a of the lead frame 10 in the +z direction, namely, the upper surface of the first portion 10a. The semiconductor chip 11 includes a drain electrode in its surface in the −z direction, namely, the lower surface of the semiconductor chip 11, and this drain electrode is in contact with the lead frame 10.

The semiconductor chip 11 includes a gate electrode 111 and a source electrode 112. The gate electrode 111 is coupled to the gate of the transistor Tr1. The gate electrode 111 contains a conductor which may be metal or the like, or is constituted by such a conductor. In one example, the gate electrode 111 is located at a position corresponding to the lower right part of the first portion 10*a* of the lead frame 10, in other words, at a position corresponding to an area of the first portion 10*a* including the lower right corner part. The gate electrode 111 has, for example, a quadrilateral shape, which may be a rectangular shape, along an x-y plane. The gate electrode 111 has a right side and a lower side extending along the right side and the lower side of the semiconductor chip 11, respectively.

The source electrode 112 is coupled to the source of the transistor Tr1. The source electrode 112 contains a conductor which may be metal or the like, or is constituted by such a conductor. In one example, the source electrode 112 has a shape along an x-y plane which includes a cutout part corresponding to the location of the gate electrode 111. More concretely, the source electrode 112 has a shape of an inverted "L" in general. In other words, the source electrode 112 has a generally quadrilateral shape with its one corner cut away in a quadrilateral profile. The source electrode 112 has, as one example, a rectangular shape including a rectangular cutout part at one corner. The generally quadrilateral shape of the source electrode 112 (i.e., the shape assumed to be without the cutout corner) has an upper side, a lower side, a left side, and a right side extending along the upper side, the lower side, the left side, and the right side of the first portion 10*a* of the lead frame 10, respectively. The cutout corner of the source electrode 112 is the lower right corner of the source electrode 112, and the gate electrode 111 is located in the vacancy after this cutout at a distance from the source electrode 112. The lower side and the right side of the generally quadrilateral shape of the source electrode 112 may be called a "major lower side" and a "major right side" of the source electrode 112, respectively.

The interconnect 16 is a conductor for electrically coupling the gate electrode 111 with the gate terminal 15. In one example, the interconnect 16 has a linear shape. The interconnect 16 is, for example, a bonding wire. The interconnect 16 contains metal or is constituted by metal. One end of the interconnect 16 is in contact with the upper surface of the gate electrode 111. The other end of the interconnect 16 is in contact with the upper surface of the gate terminal 15.

The connection member 13 is a conductor for securing the source electrode 112 and the connector 14 together, while electrically coupling the source electrode 112 and the connector 14 to one another. In one example, the connection member 13 contains solder or is constituted by solder. The connection member 13 may have substantially the same shape as the source electrode 112 along an x-y plane. For example, the shape of the connection member 13 has a similar geometry to the shape of the source electrode 112. The connection member 13 is, for example, one size smaller than the source electrode 112. That is, the edges of the connection member 13 are located slightly inside the edges of the source electrode 112. The connection member 13 is located on the upper surface of the source electrode 112 and covers almost the entire upper surface of the source electrode 112.

The connector 14 is a conductor for electrically coupling the source electrode 112 with the source terminal 17. The connector 14 has a shape which is based on the shape and the location of the source electrode 112 along a given x-y plane and also based on the shape and the location of the source terminal 17 along a given x-y plane. That is, the connector 14 has a shape which enables the connector 14 to be connected to both the source electrode 112 and the source terminal 17. More specifically, the connector 14 may have a shape along an x-y plane which at least partially overlaps the source electrode 112 on one hand and at least partially overlaps the source terminal 17 on the other hand. A description of an exemplary form of the connector 14 will be given.

As one concrete example, the connector 14 has a shape of an "L" in general, along an x-y plane. The connector 14 includes a first portion 14*a* and a second portion 14*b*. The first portion 14*a* extends over the x-y plane. The first portion 14*a* accounts for a part of the connector 14 that includes the upper side of the connector 14. The first portion 14*a* is, via its lower side, connected to the upper side of the second portion 14*b*. The entire outline of the first portion 14*a* along the x-y plane overlaps a part of the connection member 13. For example, the first portion 14*a* has a quadrilateral shape, which may be a rectangular shape, along the x-y plane. The upper side, the lower side, the left side, and the right side of the first portion 14*a* extend along the upper side, the major lower side, the left side, and the major right side of the source electrode 112, respectively. Here, the upper side, the left side, and the right side of the first portion 14*a* are located slightly inside the upper side, the left side, and the major right side of the source electrode 112, respectively.

The second portion 14*b* extends over the x-y plane. The second portion 14*b* accounts for a part of the connector 14 that includes the lower side of the connector 14. For example, the second portion 14*b* has a quadrilateral shape, which may be a rectangular shape, along the x-y plane. The left side of the second portion 14*b* is continuous with the left side of the first portion 14*a*. The size of the second portion 14*b* along the x axis is smaller than the size of the first portion 14*a* along the x axis. The second portion 14*b* overlaps a part of the connection member 13, a part of the semiconductor chip 11, a part of the lead frame 10, and a part of the source terminal 17. The lower side of the second portion 14*b* is located inside the source terminal 17.

In one example, as an overview, some shapes and the arrangements of the lead frame 20, the semiconductor chip 21, the connection member 23, the connector 24, the gate terminal 25, the interconnect 26, and the source terminal 27 are generally symmetrical to those of the lead frame 10, the semiconductor chip 11, the connection member 13, the connector 14, the gate terminal 15, the interconnect 16, and the source terminal 17, with respect to the y axis. Particulars are as follows.

The lead frame 20 extends over an x-y plane. The lead frame 20 is a conductor supporting and securing the semiconductor chip 21. The shape of the lead frame 20 is, for example, a plate-like shape. The lead frame 20 contains metal or is constituted by metal.

The lead frame 20 is located in the right part of the semiconductor device 1 and faces the right side of the semiconductor device 1. For example, the lead frame 20 has a quadrilateral shape, which may be a rectangular shape, except that a predetermined projection is present at its right part. The lead frame 20 has an upper side extending along the upper side of the sealing resin 30. A part of the lead frame 20 that includes the upper side of the lead frame 20 is exposed from the sealing resin 30. The remaining part of the lead frame 20 is located within the sealing resin 30. The lead frame 20 has a left side extending along the right side of the second portion 10*b* of the lead frame 10.

The gate terminal 25 serves as a terminal for electrically coupling the semiconductor device 1 with one or more external conductors. The gate terminal 25 extends over an x-y plane. The gate terminal 25 and the lead frame 20 are arranged along the y axis. The gate terminal 25 is located below the lead frame 20. The gate terminal 25 is at a distance from the lead frame 20. A part of the gate terminal 25 that includes the lower side of the gate terminal 25 is exposed from the sealing resin 30. The gate terminal 25 has an upper side extending along the lower side of the lead frame 20. The gate terminal 25 has, for example, a quadrilateral shape, which may be a rectangular shape, along an x-y plane.

The source terminal 27 serves as a terminal for electrically coupling the semiconductor device 1 with one or more external conductors. The source terminal 27 extends over an x-y plane. The source terminal 27 and the lead frame 20 are arranged along the y axis. The source terminal 27 is located below the lead frame 20. The source terminal 27 is at a distance from the lead frame 20. The source terminal 27 and the gate terminal 25 are arranged along the x axis. The source terminal 27 is located to the right of the gate terminal 25. A part of the source terminal 27 that includes the lower side of the source terminal 27 is exposed from the sealing resin 30. The source terminal 27 has an upper side extending along the lower side of the lead frame 20. The source terminal 27 has, for example, a quadrilateral shape, which may be a rectangular shape, along an x-y plane. The size of the source terminal 27 along the x axis is, for example, larger than the size of the gate terminal 25 along the x axis.

The semiconductor chip 21 is the same as or identical to the semiconductor chip 11. Here, the semiconductor chips 11 and 21 being identical to each other means that these semiconductor chips 11 and 21 have been formed at different areas of one semiconductor substrate through common process steps, with the intention of fabricating identical chips. Thus, the semiconductor chips 11 and 21 being identical to each other tolerates inclusion of inevitable errors or the like that occur during the manufacturing processes, and/or differences between these chips due to the limits of control accuracy, etc. The semiconductor chip 21 includes elements such as a transistor Tr2 and a diode D2 coupled in parallel with the transistor Tr2 (neither element is illustrated in the figure).

Two electrodes of the semiconductor chip 21, which correspond to the gate electrode 111 and the source electrode 112 of the semiconductor chip 11, are named a "gate electrode 211" and a "source electrode 212", respectively. The gate electrode 211 is coupled to the gate of the transistor Tr2. The source electrode 212 is coupled to the source of the transistor Tr2.

The semiconductor chip 21 is arranged in an orientation different from that of the semiconductor chip 11. More specifically, the semiconductor chip 21 here is in an orientation turned along an x-y plane by +90° from the orientation of the semiconductor chip 11. As such, the cutout corner of the source electrode 212 and the gate electrode 211 are located at the lower left part of the semiconductor chip 21. The lower side and the left side of the generally quadrilateral shape of the source electrode 212 may be called a "major lower side" and a "major left side" of the source electrode 212, respectively.

The semiconductor chip 21 in its entirety overlaps the lead frame 20 along an x-y plane. The center of the semiconductor chip 21 based on the shape along a given x-y plane is located, for example, at or near the center of the lead frame 20 based on the shape along the x-y plane. The semiconductor chip 21 is located on the upper surface of the lead frame 20. The semiconductor chip 21 includes a drain electrode in its lower surface, and this drain electrode is in contact with the lead frame 20.

The interconnect 26 is a conductor for electrically coupling the gate electrode 211 with the gate terminal 25. The interconnect 26 may have a linear shape. The interconnect 26 is, for example, a bonding wire. The interconnect 26 contains metal or is constituted by metal. One end of the interconnect 26 is in contact with the upper surface of the gate electrode 211. The other end of the interconnect 26 is in contact with the upper surface of the gate terminal 25.

The connection member 23 is a conductor for securing the source electrode 212 and the connector 24 together, while electrically coupling to one another. For example, the connection member 23 may contain solder or may be constituted by solder. The connection member 23 may have substantially the same shape as the source electrode 212 along an x-y plane. For example, the shape of the connection member 23 has a similarity relationship with the shape of the source electrode 212. The connection member 23 is, for example, one size smaller than the source electrode 212. That is, the edges of the connection member 23 are located slightly inside the edges of the source electrode 212. The connection member 23 is located on the upper surface of the source electrode 212 and covers almost the entire upper surface of the source electrode 212.

The connector 24 is a conductor for electrically coupling the source electrode 212 with the source terminal 27. The connector 24 has a shape which is based on the shape and the location of the source electrode 212 along a given x-y plane and is also based on the shape and the location of the source terminal 27 along a given x-y plane. That is, the connector 24 has a shape which enables the connector 24 to be connected to both the source electrode 212 and the source terminal 27. More specifically, the connector 24 may have a shape along an x-y plane which at least partially overlaps the source electrode 212 on one hand and at least partially overlaps the source terminal 27 on the other hand. A description of an exemplary form of the connector 24 will be given.

As one concrete example, the connector 24 has a shape of an inverted "L" in general, along an x-y plane. The connector 24 includes a first portion 24a and a second portion 24b. The first portion 24a extends over an x-y plane. The first portion 24a accounts for a part of the connector 24 that includes the upper side of the connector 24. The first portion 24a is, via its lower side, connected to the upper side of the second portion 24b. The entire outline of the first portion 24a along the x-y plane overlaps a part of the connection member 23. For example, the first portion 24a has a quadrilateral shape, which may be a rectangular shape, along the x-y plane. The upper side, the lower side, the left side, and the right side of the first portion 24a extend along the upper side, the major lower side, the major left side, and the right side of the source electrode 212, respectively. Here, the upper side, the left side, and the right side of the first portion 24a are located slightly inside the upper side, the major left side, and the right side of the source electrode 212, respectively.

The second portion 24b extends over the x-y plane. The second portion 24b accounts for a part of the connector 24 that includes the lower side of the connector 24. The second portion 24b is, via its upper side, connected to the lower side of the first portion 24a. For example, the second portion 24b has a quadrilateral shape, which may be a rectangular shape, along the x-y plane. The right side of the second portion 24b is continuous with the right side of the first portion 24a. The size of the second portion 24b along the x axis is smaller than the size of the first portion 24a along the x axis. The second portion 24b overlaps a part of the connection member 23, a part of the semiconductor chip 21, a part of the lead frame 20, and a part of the source terminal 27. The lower side of the second portion 24b is located inside the source terminal 27.

FIG. 3 shows, along an x-y plane, a structure of a part of the semiconductor device 1 according to the first embodiment. FIG. 3 shows the structure of the lead frame 10 along an x-y plane in more detail. As shown in FIG. 3, and also as described above with reference to FIG. 2, the lead frame 10 includes the first portion 10a and the second portion 10b. The second portion 10b includes a first sub-portion 10bA and a second sub-portion 10bB.

The first sub-portion 10bA accounts for a part of the second portion 10b that includes the right side of the second portion 10b. For example, the first sub-portion 10bA has a quadrilateral shape, which may be a rectangular shape having a longer side along the y axis. The first sub-portion 10bA is located to the right of the first portion 10a. The first sub-portion 10bA is located at a higher level than the first portion 10a based on the z axis (located in the +z direction).

The second sub-portion 10bB accounts for a part of the second portion 10b that includes the left side of the second portion 10b. The second sub-portion 10bB is, via its left side, connected to the right side of the first portion 10a. Also, the second sub-portion 10bB is, via its right side, connected to the left side of the first sub-portion 10bA. As such, the second sub-portion 10bB is inclined with respect to an x-y plane. The second sub-portion 10bB has, for example, a quadrilateral shape along an x-y plane, which may be a rectangular shape having a longer side along the y axis.

FIG. 4 shows a structure of a part of the semiconductor device 1 according to the first embodiment, taken along a given x-z plane. What is shown in FIG. 4 is the structure along the line IV-IV in FIG. 2. As shown in FIG. 4, and also as described above with reference to FIG. 3, the first sub-portion 10bA of the lead frame 10 is located at a higher level than the first portion 10a based on the z axis. The second sub-portion 10bB connects the first portion 10a and the first sub-portion 10bA together. The semiconductor chip 11 is located on the upper surface of the first portion 10a. The source electrode 112 is located on the upper surface of the semiconductor chip 11. The connection member 13 is located on the upper surface of the source electrode 112. The connector 14 is located on the upper surface of the connection member 13.

FIG. 5 shows, along an x-y plane, a structure of a part of the semiconductor device 1 according to the first embodiment. FIG. 5 shows the structure along an x-y plane, including the gate terminal 15, the source terminal 17, the gate terminal 25, and the source terminal 27 in more detail. As shown in FIG. 5, the source terminal 17 includes a first portion 17a, a second portion 17b, and a third portion 17c.

The first portion 17a accounts for a part of the source terminal 17 that includes the lower side of the source terminal 17. For example, the first portion 17a has a quadrilateral shape, which may be a rectangular shape, along the x-y plane. A part of the first portion 17a that includes the lower side of the first portion 17a is exposed from the sealing resin 30 (not illustrated). In one example, the first portion 17a is located at coordinates conforming to or close to the coordinates of the semiconductor chip 11, based on the z axis.

The second portion 17b is, via its lower side, connected to the upper side of the first portion 17a. The second portion 17b is inclined with respect to an x-y plane, such that the upper side of the second portion 17b is located at a higher level than the lower side of the second portion 17b based on the z axis. For example, the second portion 17b has a quadrilateral shape, which may be a rectangular shape, along the x-y plane.

The third portion 17c is, via its lower side, connected to the upper side of the second portion 17b. The third portion 17c is located at a higher level than the first portion 17a based on the z axis. For example, the third portion 17c has a quadrilateral shape, which may be a rectangular shape, along the x-y plane.

The gate terminal 15 includes a first portion 15a, a second portion 15b, and a third portion 15c. The first portion 15a accounts for a part of the gate terminal 15 that includes the lower side of the gate terminal 15. In one example, the first portion 15a is arranged in line with the first portion 17a of the source terminal 17 along the x axis. For example, the first portion 15a has a quadrilateral shape, which may be a rectangular shape, along the x-y plane. A part of the first portion 15a that includes the lower side of the first portion 15a is exposed from the sealing resin 30 (not illustrated). In one example, the first portion 15a is located at coordinates conforming to or close to the coordinates of the semiconductor chip 11, based on the z axis.

The second portion 15b is, via its lower side, connected to the upper side of the first portion 15a. In one example, the second portion 15b is arranged in line with the second portion 17b of the source terminal 17 along the x axis. The second portion 15b is inclined with respect to an x-y plane, such that the upper side of the second portion 15b is located at a higher level than the lower side of the second portion 15b based on the z axis. For example, the second portion 15b has a quadrilateral shape, which may be a rectangular shape, along the x-y plane.

The third portion 15c is, via its lower side, connected to the upper side of the second portion 15b. In one example, the third portion 15c is arranged in line with the third portion 17c of the source terminal 17 along the x axis. The third portion 15c is located at a higher level than the first portion 15a based on the z axis. In one example, the third portion 15c is located at coordinates conforming to or close to the coordinates of the third portion 17c of the source terminal 17, based on the z axis. For example, the third portion 15c has a quadrilateral shape, which may be a rectangular shape, along the x-y plane.

The gate terminal 25 includes a first portion 25a, a second portion 25b, and a third portion 25c. The first portion 25a accounts for a part of the gate terminal 25 that includes the lower side of the gate terminal 25. In one example, the first portion 25a is arranged in line with the first portion 15a of the gate terminal 15 along the x axis. For example, the first portion 25a has a quadrilateral shape, which may be a rectangular shape, along the x-y plane. A part of the first portion 25a that includes the lower side of the first portion 25a is exposed from the sealing resin 30 (not illustrated). In one example, the first portion 25a is located at coordinates conforming to or close to the coordinates of the semiconductor chip 11, based on the z axis.

The second portion 25b is, via its lower side, connected to the upper side of the first portion 25a. In one example, the second portion 25b is arranged in line with the second portion 15b of the gate terminal 15 along the x axis. The second portion 25b is inclined with respect to an x-y plane, such that the upper side of the second portion 25b is located at a higher level than the lower side of the second portion 25b based on the z axis. For example, the second portion 25b has a quadrilateral shape, which may be a rectangular shape, along the x-y plane.

The third portion 25*c* is, via its lower side, connected to the upper side of the second portion 25*b*. In one example, the third portion 25*c* is arranged in line with the third portion 15*c* of the gate terminal 15 along the x axis. The third portion 25*c* is located at a higher level than the first portion 25*a* based on the z axis. In one example, the third portion 25*c* is located at coordinates conforming to or close to the coordinates of the third portion 15*c* of the gate terminal 15, based on the z axis. For example, the third portion 25*c* has a quadrilateral shape, which may be a rectangular shape, along the x-y plane.

The source terminal 27 includes a first portion 27*a*, a second portion 27*b*, and a third portion 27*c*. The first portion 27*a* accounts for a part of the source terminal 27 that includes the lower side of the source terminal 27. In one example, the first portion 27*a* is arranged in line with the first portion 25*a* of the gate terminal 25 along the x axis. For example, the first portion 25*a* has a quadrilateral shape, which may be a rectangular shape, along the x-y plane. A part of the first portion 27*a* that includes the lower side of the first portion 27*a* is exposed from the sealing resin 30 (not illustrated). In one example, the first portion 27*a* is located at coordinates conforming to or close to the coordinates of the semiconductor chip 11, based on the z axis.

The second portion 27*b* is, via its lower side, connected to the upper side of the first portion 27*a*. In one example, the second portion 27*b* is arranged in line with the second portion 25*b* of the gate terminal 25 along the x axis. The second portion 27*b* is inclined with respect to an x-y plane, such that the upper side of the second portion 27*b* is located at a higher level than the lower side of the second portion 27*b* based on the z axis. For example, the second portion 27*b* has a quadrilateral shape, which may be a rectangular shape, along the x-y plane.

The third portion 27*c* is, via its lower side, connected to the upper side of the second portion 27*b*. In one example, the third portion 27*c* is arranged in line with the third portion 25*c* of the gate terminal 25 along the x axis. The third portion 27*c* is located at a higher level than the first portion 27*a* based on the z axis. In one example, the third portion 27*c* is located at coordinates conforming to or close to the coordinates of the third portion 25*c* of the gate terminal 25, based on the z axis. For example, the third portion 27*c* has a quadrilateral shape, which may be a rectangular shape, along the x-y plane.

Figure 6:
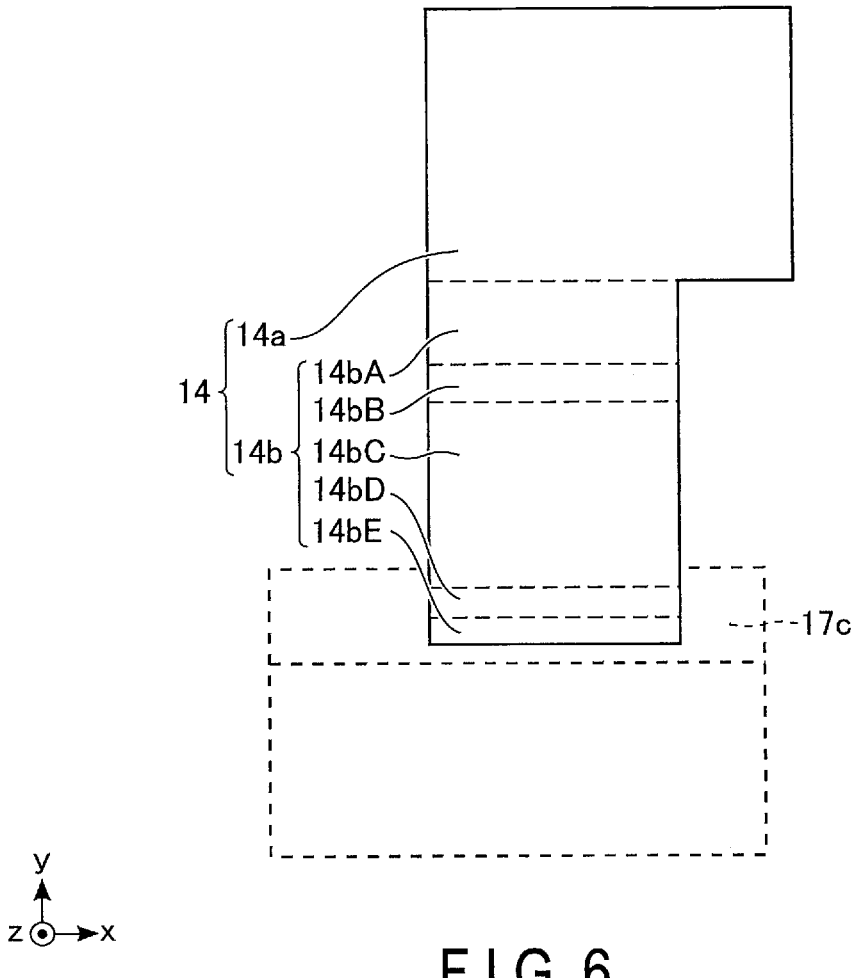
FIG. 6 shows, along a given x-y plane, a structure of a connector of the semiconductor device according to the first embodiment.

FIG. 6 shows, along an x-y plane, a structure of a part of the semiconductor device 1 according to the first embodiment. FIG. 6 shows the structure of the connector 14 along an x-y plane in more detail. As shown in FIG. 6, and also as described above with reference to FIG. 2, the connector 14 includes the first portion 14*a* and the second portion 14*b*.

The second portion 14*b* includes a first sub-portion 14*b*A, a second sub-portion 14*b*B, a third sub-portion 14*b*C, a fourth sub-portion 14*b*D, and a fifth sub-portion 14*b*E. The left side of the first portion 14*a*, and also the respective left sides of the first sub-portion 14*b*A, the second sub-portion 14*b*B, the third sub-portion 14*b*C, the fourth sub-portion 14*b*D, and the fifth sub-portion 14*b*E are continuous with one another. The respective right sides of the first sub-portion 14*b*A, the second sub-portion 14*b*B, the third sub-portion 14*b*C, the fourth sub-portion 14*b*D, and the fifth sub-portion 14*b*E are continuous with one another.

The first sub-portion 14*b*A accounts for a part of the second portion 14*b* that includes the upper side of the second portion 14*b*. For example, the first sub-portion 14*b*A has a quadrilateral shape, which may be a rectangular shape, along the x-y plane. In one example, the first sub-portion 14*b*A is located at coordinates conforming to or close to the coordinates of the first portion 14*a*, based on the z axis.

The second sub-portion 14*b*B is, via its upper side, connected to the lower side of the first sub-portion 14*b*A. The second sub-portion 14*b*B is inclined with respect to an x-y plane, such that the lower side of the second sub-portion 14*b*B is located at a higher level than the upper side of the second sub-portion 14*b*B based on the z axis. For example, the second sub-portion 14*b*B has a quadrilateral shape, which may be a rectangular shape, along the x-y plane.

The third sub-portion 14*b*C accounts for a part of the second portion 14*b* that includes the center of the second portion 14*b*. The third sub-portion 14*b*C is located at a higher level than the first sub-portion 14*b*A based on the z axis. For example, the third sub-portion 14*b*C has a quadrilateral shape, which may be a rectangular shape, along the x-y plane.

The fourth sub-portion 14*b*D is, via its upper side, connected to the lower side of the third sub-portion 14*b*C. The fourth sub-portion 14*b*D is inclined with respect to an x-y plane, such that the lower side of the fourth sub-portion 14*b*D is located at a lower level than the upper side of the fourth sub-portion 14*b*D based on the z axis. For example, the fourth sub-portion 14*b*D has a quadrilateral shape, which may be a rectangular shape, along the x-y plane.

The fifth sub-portion 14*b*E accounts for a part of the second portion 14*b* that includes the lower side of the second portion 14*b*. The entire outline of the fifth sub-portion 14*b*E along the x-y plane overlaps the third portion 17*c* of the source terminal 17. The fifth sub-portion 14*b*E is located at a lower level than the third sub-portion 14*b*C based on the z axis. For example, the fifth sub-portion 14*b*E has a quadrilateral shape, which may be a rectangular shape, along the x-y plane.

In the example shown in FIG. 6, a part of the third sub-portion 14*b*C, the whole of the fourth sub-portion 14*b*D, and the whole of the fifth sub-portion 14*b*E overlap the third portion 17*c* of the source terminal 17. Note, however, that the third sub-portion 14*b*C, the fourth sub-portion 14*b*D, and the fifth sub-portion 14*b*E are not limited to the exemplary arrangement, etc., shown in FIG. 6. The third sub-portion 14*b*C, the fourth sub-portion 14*b*D, and the fifth sub-portion 14*b*E may have any shapes and may be arranged in any layout, as long as the part of the connector 14 that includes the lower side of the connector 14 at least partially overlaps the third portion 17*c* of the source terminal 17.

FIG. 7 shows a structure of a part of the semiconductor device 1 according to the first embodiment, taken along a given x-z plane. What is shown in FIG. 7 is the structure along the line VII-VII in FIG. 2. As shown in FIG. 7, the first portion 14*a* and the first sub-portion 14*b*A of the connector 14 are located on the upper surface of the connection member 13. The third sub-portion 14*b*C is located at a higher level than the first portion 14*a* and the first sub-portion 14*b*A based on the z axis. The second sub-portion 14*b*B connects the first sub-portion 14*b*A and the third sub-portion 14*b*C together.

The fifth sub-portion 14*b*E is located at a lower level than the third sub-portion 14*b*C based on the z axis. A connection member 18 is provided between the lower surface of the fifth sub-portion 14*b*E and the upper surface of the third portion 17*c* of the source terminal 17. The connection member 18 is a conductor for securing the fifth sub-portion 14*b*E and the source terminal 17 together, while electrically coupling the fifth sub-portion 14*b*E and the source terminal 17 to one another. For example, the connection member 18 may contain solder or may be constituted by solder.

The fourth sub-portion 14*b*D connects the third sub-portion 14*b*C and the fifth sub-portion 14*b*E together.

FIG. 8 shows, along an x-y plane, a structure of a part of the semiconductor device 1 according to the first embodiment. FIG. 8 shows the structure of the connector 24 along an x-y plane in more detail. As shown in FIG. 8, and also as described above with reference to FIG. 2, the connector 24 includes the first portion 24*a* and the second portion 24*b*.

The second portion 24*b* includes a first sub-portion 24*b*A, a second sub-portion 24*b*B, a third sub-portion 24*b*C, a fourth sub-portion 24*b*D, and a fifth sub-portion 24*b*E. The right side of the first portion 24*a*, and also the respective right sides of the first sub-portion 24*b*A, the second sub-portion 24*b*B, the third sub-portion 24*b*C, the fourth sub-portion 24*b*D, and the fifth sub-portion 24*b*E are continuous with one another. The respective left sides of the first sub-portion 24*b*A, the second sub-portion 24*b*B, the third sub-portion 24*b*C, the fourth sub-portion 24*b*D, and the fifth sub-portion 24*b*E are continuous with one another.

The first sub-portion 24*b*A accounts for a part of the second portion 24*b* that includes the upper side of the second portion 24*b*. For example, the first sub-portion 24*b*A has a quadrilateral shape, which may be a rectangular shape, along the x-y plane. In one example, the first sub-portion 24*b*A is located at coordinates conforming to or close to the coordinates of the first portion 24*a*, based on the z axis.

The second sub-portion 24*b*B is, via its upper side, connected to the lower side of the first sub-portion 24*b*A. The second sub-portion 24*b*B is inclined with respect to an x-y plane, such that the lower side of the second sub-portion 24*b*B is located at a higher level than the upper side of the second sub-portion 24*b*B based on the z axis. For example, the second sub-portion 24*b*B has a quadrilateral shape, which may be a rectangular shape, along the x-y plane.

The third sub-portion 24*b*C accounts for a part of the second portion 24*b* that includes the center of the second portion 24*b*. The third sub-portion 24*b*C is located at a higher level than the first sub-portion 24*b*A based on the z axis. For example, the third sub-portion 24*b*C has a quadrilateral shape, which may be a rectangular shape, along the x-y plane.

The fourth sub-portion 24*b*D is, via its upper side, connected to the lower side of the third sub-portion 24*b*C. The fourth sub-portion 24*b*D is inclined with respect to an x-y plane, such that the lower side of the fourth sub-portion 24*b*D is located at a lower level than the upper side of the fourth sub-portion 24*b*D based on the z axis. For example, the fourth sub-portion 24*b*D has a quadrilateral shape, which may be a rectangular shape, along the x-y plane.

The fifth sub-portion 24*b*E accounts for a part of the second portion 24*b* that includes the lower side of the second portion 24*b*. The entire outline of the fifth sub-portion 24*b*E along the x-y plane overlaps the third portion 27*c* of the source terminal 27. The fifth sub-portion 24*b*E is located at a lower level than the third sub-portion 24*b*C based on the z axis. For example, the fifth sub-portion 24*b*E has a quadrilateral shape, which may be a rectangular shape, along the x-y plane.

In the example shown in FIG. 8, a part of the third sub-portion 24*b*C, the whole of the fourth sub-portion 24*b*D, and the whole of the fifth sub-portion 24*b*E overlap the third portion 27*c* of the source terminal 27. Note, however, that the third sub-portion 24*b*C, the fourth sub-portion 24*b*D, and the fifth sub-portion 24*b*E are not limited to the exemplary arrangement, etc., shown in FIG. 8. The third sub-portion 24*b*C, the fourth sub-portion 24*b*D, and the fifth sub-portion 24*b*E may have any shapes and may be arranged in any layout, as long as the part of the connector 24 that includes the lower side of the connector 24 at least partially overlaps the third portion 27*c* of the source terminal 27.

Figure 9:
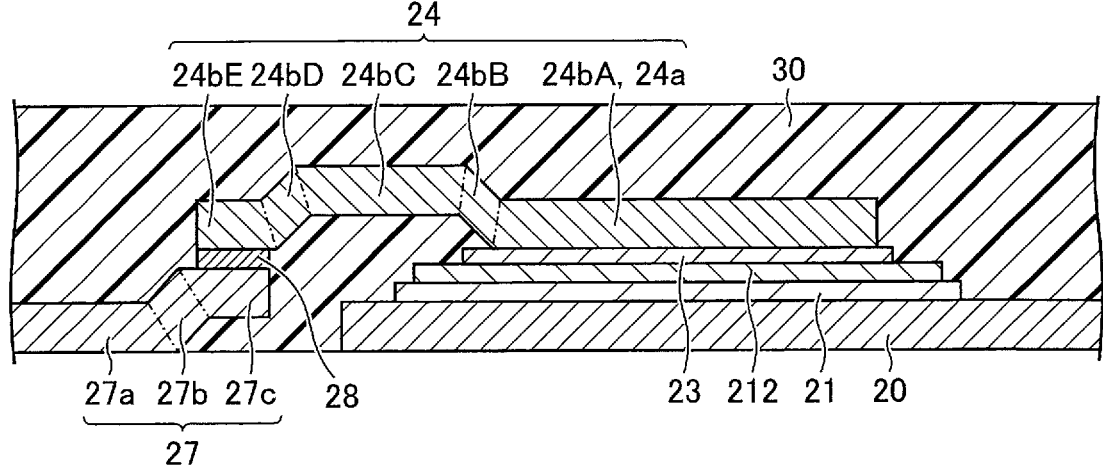
FIG. 9 shows a structure of a part of the semiconductor device according to the first embodiment, taken along a given x-z plane.

FIG. 9 shows a structure of a part of the semiconductor device 1 according to the first embodiment, taken along a given x-z plane. What is shown in FIG. 9 is the structure along the line IX-IX in FIG. 2. As shown in FIG. 9, the first portion 24*a* and the first sub-portion 24*b*A of the connector 24 are located on the upper surface of the connection member 23. The third sub-portion 24*b*C is located at a higher level than the first portion 24*a* and the first sub-portion 24*b*A based on the z axis. The second sub-portion 24*b*B connects the first sub-portion 24*b*A and the third sub-portion 24*b*C together.

The fifth sub-portion 24*b*E is located at a lower level than the third sub-portion 24*b*C based on the z axis. A connection member 28 is provided between the lower surface of the fifth sub-portion 24*b*E and the upper surface of the third portion 27*c* of the source terminal 27. The connection member 28 is a conductor for securing the fifth sub-portion 24*b*E and the source terminal 27 together, while electrically coupling the fifth sub-portion 24*b*E and the source terminal 27 to one another. For example, the connection member 28 may contain solder or may be constituted by solder.

The fourth sub-portion 24*b*D connects the third sub-portion 24*b*C and the fifth sub-portion 24*b*E together.

FIG. 10 shows a circuit realized by the semiconductor device 1 according to the first embodiment. This circuit by the semiconductor device 1 includes a circuit C11 realized by the semiconductor chip 11 and a circuit C21 realized by the semiconductor chip 21. In the semiconductor device 1, the circuit C11 and the circuit C21 are independent of each other.

As shown in FIG. 10, and also as understood from the above description with reference to FIG. 2, the circuit C11 includes the transistor Tr1 and the diode D1. The gate of the transistor Tr1 is coupled to the gate terminal 15. The source of transistor Tr1 is coupled to the source terminal 17. The drain of the transistor Tr1 is coupled to the lead frame 10. The anode of the diode D1 is coupled to the drain of the transistor Tr1. The cathode of the diode D1 is coupled to the source of the transistor Tr1.

As shown in FIG. 10, and also as understood from the above description with reference to FIG. 2, the circuit C21 includes the transistor Tr2 and the diode D2. The gate of the transistor Tr2 is coupled to the gate terminal 25. The source of transistor Tr2 is coupled to the source terminal 27. The drain of the transistor Tr2 is coupled to the lead frame 20. The anode of the diode D2 is coupled to the drain of the transistor Tr2. The cathode of the diode D2 is coupled to the source of the transistor Tr2.

The semiconductor device 1 is usable as a device for providing functions including a switching function between two given external nodes, a fail-safe function of inhibiting a reverse current opposite to the current in an intended direction from flowing between two nodes, and so on.

FIG. 11 shows a circuit in an exemplary application of the semiconductor device 1 according to the first embodiment. The semiconductor device 1 here is adopted as a part of an apparatus 100. The apparatus 100 includes a battery 101, the semiconductor device 1, a control circuit 102, a switching circuit 103, and a sub-circuit 104.

As shown in FIG. 11, the drain of the transistor Tr2 and the cathode of the diode D2 are coupled to each other, and are also coupled to the positive electrode terminal of the battery 101, via a node N1. The source of the transistor Tr2, the anode of the diode D2, the source of the transistor Tr1, and the anode of the diode D1 are coupled to each other via a node N2. The transistors Tr1 and Tr2 receive, via their respective gates, a control signal S1 from the control circuit 102.

The drain of the transistor Tr1 and the cathode of the diode D1 are coupled to a first end E1 of the switching circuit 103 via a node N3. The switching circuit 103 has a second end E2 coupled to the sub-circuit 104. The switching circuit 103 electrically coupling the first end E1 and the second end E2 with each other, or electrically separates first end E1 and the second end E2 from each other, according to a control signal S2. In one example, the control signal S2 is provided from the control circuit 102.

Figure 12:
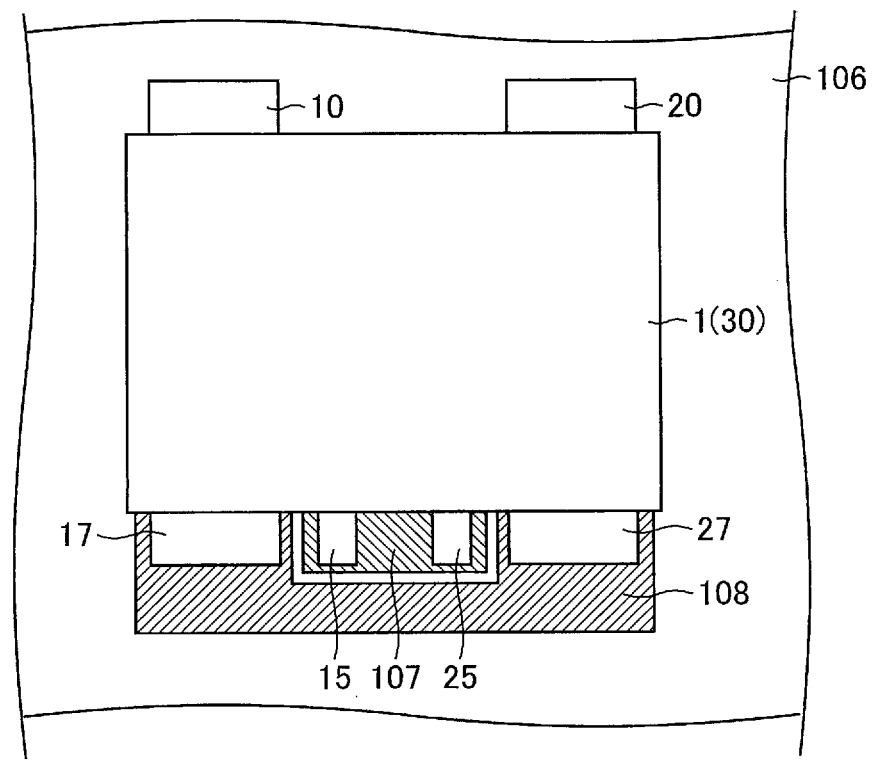
FIG. 12 shows, along a given x-y plane, a structure of a part of a device to which the semiconductor device according to the first embodiment is applied.
Figure 12:
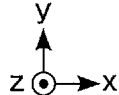

FIG. 12 shows, along a given x-y plane, a structure of a part of the apparatus 100 that adopts the semiconductor device 1 according to the first embodiment. FIG. 12 covers a part of a printed circuit board 106 included in the apparatus 100, where the semiconductor device 1 is provided. Assuming the use of the semiconductor device 1 as a component of the apparatus 100, the gate of the transistor Tr1 and the gate of the transistor Tr2 need to be electrically coupled to each other as discussed above with reference to FIG. 11. To this end, the printed circuit board 106 includes a conductor (pattern) 107 which has an upper surface in contact with the respective lower surfaces of the gate terminals 15 and 25.

Also, as discussed above with reference to FIG. 11, the source of the transistor Tr2 and the anode of the diode D2 need to be coupled to the source of the transistor Tr1 and the anode of the diode D1. Accordingly, the source terminals 17 and 27 need to be electrically coupled to each other on the printed circuit board 106. To this end, the printed circuit board 106 includes a conductor 108 which has an upper surface in contact with the respective lower surfaces of the source terminals 17 and 27. In one example, the conductor 108 has a quadrilateral shape from which a region corresponding to the conductor 107 is cut away.

During the operation of the apparatus 100 under a normal state, currents flow in the semiconductor device 1 as described below with reference to FIG. 13. The normal state of the apparatus 100 refers to the condition where the component couplings shown in FIG. 11 are established, in particular, where the positive electrode terminal of the battery 101 is coupled to the node N1. Under the normal state, the node N1 has a higher potential than the node N2, and the node N2 has a higher potential than the node N3.

While the apparatus 100 is under the normal state and also in the ON state, the control signal S1 is of a high potential, that is, has a size sufficiently capable of turning ON the transistors Tr1 and Tr2. As such, a current flows from the node N1 toward the node N2 via the transistor Tr2. FIG. 13 shows the flow of each current using a thick solid line. Meanwhile, the diode D2 is being fed a reverse bias, and as such, no current flows via the diode D2. The non-flowing current is shown using a broken line.

Also, a current flows from the node N2 toward the node N3 via the transistor Tr1. Further, a current flows from the node N2 toward the node N3 via the diode D1, as the diode D1 is being fed a forward bias.

While the apparatus 100 is under an abnormal state, a current would flow in the semiconductor device 1 as shown in FIG. 14 and as will be described. The abnormal state of the apparatus 100 refers to the condition where the component couplings shown in FIG. 11 are not established, in particular, where the negative electrode terminal of the battery 101 is coupled to the node N1. Such an abnormal state could unintentionally occur during the exchange of the battery 101. Under the abnormal state, the node N3 can have a higher potential than the node N2.

As discussed, the abnormal state could occur during the exchange of the battery 101, where the apparatus 100 is not properly operating or operable. The control signal S1 is accordingly of a low potential, that is, has a size that maintains the transistors Tr1 and Tr2 in an OFF state. As such, no current flows between the drain and the source of the transistor Tr1.

As discussed, the potential of the node N3 here could be higher than the potential of the node N2. In this state, namely, where the diode D1 is fed a reverse bias, no current flows via the diode D1. Therefore, the transistor Tr1 and the diode D1 serve to suppress or inhibit the flow of a current between the node N3 and the node N2. Consequently, the flow of a reverse current opposite to the current in an intended direction is suppressed or inhibited from occurring in the stage beyond the node N3 (e.g., the sub-circuit 104), in instances where the abnormal state of the apparatus 100 emerges.

As discussed, the control signal S1 during the abnormal state is of a low potential, that is, has a size that maintains the transistors Tr1 and Tr2 in an OFF state. Thus, no current flows between the drain and the source of the transistor Tr2. During the abnormal state, the node N2 side can have a higher potential than the node N1 side, and accordingly, the diode D2 may be fed a forward bias once a current flows into the node N2. However, in actuality, a current flow from the node N3 to the node N2 is suppressed or inhibited by the functions of the transistor Tr1 and the diode D1. This eliminates the occurrence of a forward bias application to the diode D2. Therefore, the suppression or the inhibition of a current flow from the node N2 toward the node N1 is secured.

In this manner, the flow of a current from the node N3 to the node N1 during the abnormal state of the apparatus 100 is suppressed or inhibited by the functions of the semiconductor device 1.

The configurations described with reference to FIGS. 1 to 9 realize the form of the semiconductor device 1 including the circuit C11 and the circuit C21 which are independent of each other. In the following description, such a form with mutually independent circuits C11 and C12 may be called an "independent type" or a "basic" form. Note, however, that the semiconductor device 1 can also realize the form with the circuits C11 and C12 which are coupled in series, only by introducing a difference in a particular part from the independent type. FIG. 15 shows such a form, i.e., a first modification of the first embodiment. The description may refer to the form with the serially coupled circuits C11 and C12 as an "internal coupling type". FIG. 15 uses solid lines to indicate components disposed within a semiconductor device 1b according to the first modification of the first embodiment, and uses dashed-dotted lines to indicate the exterior of the semiconductor device 1b.

As shown in FIG. 15, the semiconductor device 1b according to the first modification includes a connector 34 in place of the connector 24 of the independent type semiconductor device 1 shown in FIG. 2. That is, except for the difference in the connector 24 or the connector 34, the semiconductor device 1b is constituted by the same components (namely, the lead frame 10, the semiconductor chip 11, the connection member 13, the connector 14, the gate terminal 15, the interconnect 16, the source terminal 17, the lead frame 20, the semiconductor chip 21, the connection member 23, the gate terminal 25, the interconnect 26, the source terminal 27, and the sealing resin 30), the same component arrangements, and the same component couplings as those of the semiconductor device 1.

The connector 34 is a conductor for electrically coupling the source electrode 212 with the lead frame 10. The connector 34 has a shape which is based on the shape and the location of the source electrode 212 along a given x-y plane and is also based on the shape and the location of the lead frame 10 along a given x-y plane. That is, the connector 34 has a shape which enables the connector 34 to be connected to both the source electrode 212 and the lead frame 10. More specifically, the connector 34 may have a shape along an x-y plane which at least partially overlaps the source electrode 212 on one hand and at least partially overlaps the lead frame 10 on the other hand. An exemplary form of the connector 34 will be described.

As one concrete example, the connector 34 has a shape of an inverted "L" in general, along an x-y plane. The connector 34 includes a first portion 34a, a second portion 34b, a third portion 34c, and a fourth portion 34d. The first portion 34a extends over an x-y plane. The first portion 34a accounts for a part of the connector 34 that includes the right side of the connector 34. The first portion 34a is, via its left side, connected to the right side of the second portion 34b. The entire outline of the first portion 34a along the x-y plane overlaps a part of the connection member 23. For example, the first portion 34a has a quadrilateral shape, which may be a rectangular shape, along the x-y plane. The upper side, the lower side, the left side, and the right side of the first portion 34a extend along the upper side, the major lower side, the major left side, and the right side of the source electrode 212, respectively. Here, the upper side, the lower side, and the right side of the first portion 34a are located slightly inside the upper side, the major lower side, and the right side of the source electrode 212, respectively.

The second portion 34b extends over the x-y plane. The second portion 34b accounts for a part of the connector 34 that is located to the left of the first portion 34a. The second portion 34b is, via its right side, connected to the left side of the first portion 34a. For example, the second portion 34b has a quadrilateral shape, which may be a rectangular shape, along the x-y plane. The upper side of the second portion 34b is continuous with the upper side of the first portion 34a. The size of the second portion 34b along the y axis is smaller than the size of the first portion 34a along the y axis. The second portion 34b overlaps a part of the connection member 23, and a part of the semiconductor chip 21. For example, the left side of the second portion 34b overlaps a part of the semiconductor chip 21.

The third portion 34c extends over the x-y plane. The third portion 34c accounts for a part of the connector 34 that is located to the left of the second portion 34b. The third portion 34c is, via its right side, connected to the left side of the second portion 34b. For example, the third portion 34c has a quadrilateral shape along the x-y plane. For example, the shape of the third portion 34c is a trapezoidal shape along the x-y plane. In this exemplary shape, the left side of the third portion 34c has a size larger than the right side of the first portion 34a along the y axis.

The fourth portion 34d extends over the x-y plane. The fourth portion 34d accounts for a part of the connector 34 that is located to the left of the third portion 34c and that includes the left side of the connector 34. The fourth portion 34d is, via its right side, connected to the left side of the third portion 34c. For example, the fourth portion 34d has a quadrilateral shape, which may be a rectangular shape, along the x-y plane. The fourth portion 34d overlaps the first portion 10a of the lead frame 10. That is, the left side of the fourth portion 34d is located inside the first portion 10a of the lead frame 10.

Figure 16:
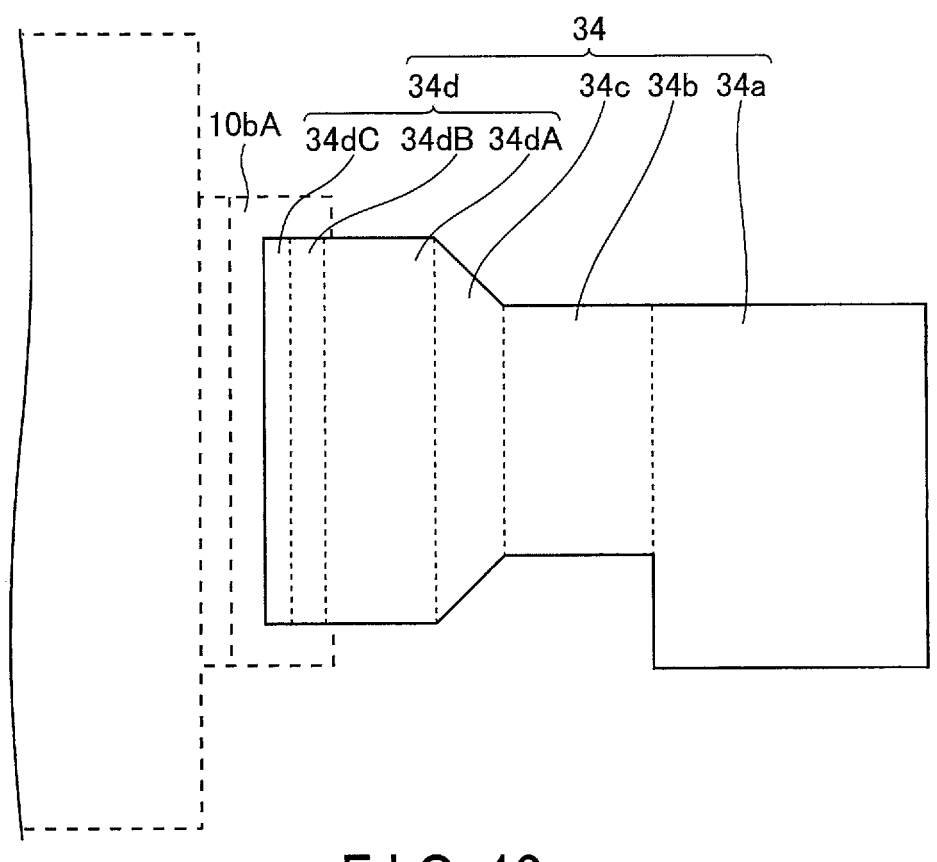
FIG. 16 shows, along a given x-y plane, a structure of a connector of the semiconductor device according to the first modification of the first embodiment.

FIG. 16 shows, along an x-y plane, a structure of a part of the semiconductor device 1b according to this modification of the first embodiment. FIG. 16 shows the structure of the connector 34 along an x-y plane in more detail. As shown in FIG. 16, and also as described above with reference to FIG. 15, the connector 34 includes the first portion 34a, the second portion 34b, the third portion 34c, and the fourth portion 34d.

The third portion 34c is inclined with respect to an x-y plane, such that the left side of the third portion 34c is located at a higher level than the right side of the third portion 34c based on the z axis.

The fourth portion 34d includes a first sub-portion 34dA, a second sub-portion 34dB, and a third sub-portion 34dC. The first sub-portion 34dA accounts for a part of the fourth portion 34d that includes the right side of the fourth portion 34d. The first sub-portion 34dA is, via its right side, connected to the left side of the third portion 34c. The first sub-portion 34dA is located at a higher level than the first portion 34a and the second portion 34b based on the z axis. For example, the first sub-portion 34dA has a quadrilateral shape, which may be a rectangular shape.

The second sub-portion 34dB accounts for a center part of the fourth portion 34d. The second sub-portion 34dB is, via its right side, connected to the left side of the first sub-portion 34dA. The second sub-portion 34dB is inclined with respect to an x-y plane, such that the left side of the second sub-portion 34dB is located at a lower level than the right side of the second sub-portion 34dB based on the z axis. For example, the second sub-portion 34dB has a quadrilateral shape, which may be a rectangular shape.

The third sub-portion 34dC accounts for a part of the fourth portion 34d that includes the left side of the fourth portion 34d. The third sub-portion 34dC is, via its right side, connected to the left side of the second sub-portion 34dB. The third sub-portion 34dC is located at a lower level than the first sub-portion 34dA based on the z axis. For example, the third sub-portion 34dC has a quadrilateral shape, which may be a rectangular shape.

In the example shown in FIG. 16, the whole of the second sub-portion 34dB and the whole of the third sub-portion 34dC overlap the first sub-portion 10bA of the lead frame 10. Note, however, that the second sub-portion 34dB and the third sub-portion 34dC are not limited to the exemplary arrangement, etc., shown in FIG. 16. The second sub-portion 34dB and the third sub-portion 34dC may have any shapes and may be arranged in any layout, as long as the part of the connector 34 that includes the left side of the connector 34 at least partially overlaps the first sub-portion 10bA of the lead frame 10.

Figure 17:
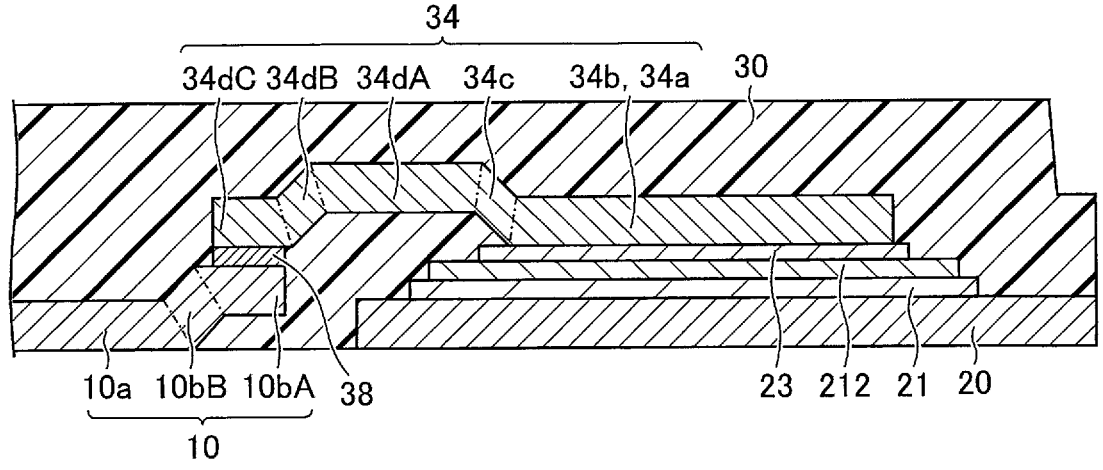
FIG. 17 shows a structure of a part of the semiconductor device according to the first modification of the first embodiment, taken along a given x-z plane.

FIG. 17 shows a structure of a part of the semiconductor device 1b according to the first modification of the first embodiment, taken along a given x-z plane. What is shown in FIG. 17 is the structure along the line XVII-XVII in FIG. 15. As shown in FIG. 17, the first portion 34a and the second portion 34b of the connector 34 are located on the upper surface of the connection member 23. The first sub-portion 34dA is located at a higher level than the first portion 34a and the second portion 34b based on the z axis. The third portion 34c connects the second portion 34b and the first sub-portion 34dA together.

The third sub-portion 34dC is located at a lower level than the first sub-portion 34dA based on the z axis. A connection member 38 is provided between the lower surface of the third sub-portion 34dC and the upper surface of the first sub-portion 10bA of the lead frame 10. The connection member 38 is a conductor for securing the third sub-portion 34dC and the first sub-portion 10bA of the lead frame 10 together, while electrically coupling the third sub-portion 34dC and the first sub-portion 10bA to one another. For example, the connection member 38 may contain solder or may be constituted by solder.

The second sub-portion 34dB connects the first sub-portion 34dA and the third sub-portion 34dC together.

FIG. 18 shows a circuit realized by the semiconductor device 1b according to the first modification of the first embodiment. The circuit by the semiconductor device 1b includes a circuit C11 realized by the semiconductor chip 11 and a circuit C21 realized by the semiconductor chip 21, as in the basic form semiconductor device 1 according to the first embodiment shown in FIG. 10. However, in contrast to the semiconductor device 1, the semiconductor device 1b uses a configuration in which a set of the source of the transistor Tr2 and the anode of the diode D2 is coupled to a set of the drain of the transistor Tr1 and the cathode of the diode D1.

The semiconductor device 1b according to the first modification, that is, the internal coupling type semiconductor device 1b, may be applied as the switching circuit 103 in the foregoing description given with reference to FIG. 10. In this case, the gate terminals 15 and 25 (i.e., the gates of the transistors Tr1 and Tr2) are coupled to each other and receive the control signal S2. The lead frame 20 (i.e., the drain of the transistor Tr2) of the semiconductor device 1b is, in the outside of the semiconductor device 1b, coupled to the lead frame 10 (i.e., the drain of the transistor Tr1) of the semiconductor device 1b.

The semiconductor device 1b according to the first modification can be realized only by providing and arranging the connector 34 in place of the connector 24. In other words, use of the above-described structures other than the connector 24 or 34 together with the selective use of the connectors 24 and 34 enables either the fabrication of the basic form semiconductor device 1 or the fabrication of the semiconductor device 1b according to the first modification as desired.

According to the first embodiment, a semiconductor device capable of providing functions including a switching function and a reverse current prevention function, as well as having easy-to-implement properties, can be provided.

The switching function and the reverse current prevention function can be realized by having a printed circuit board form thereon appropriate electrical couplings of the connection terminals (external connectors) of a semiconductor device which includes a circuit C11 and a circuit C21, as in the semiconductor device 1 (c.f., FIG. 10). Such a semiconductor device is obtainable by disposing, in one semiconductor device, two identical semiconductor chips each including a transistor and a diode coupled in parallel with each other, as in the semiconductor device 1. Use of two identical semiconductor chips facilitates the manufacture of the semiconductor device.

As one option for realizing the switching function and the reverse current prevention function through a semiconductor device including two identical semiconductor chips, that is, for realizing the circuit shown in FIG. 10, the description will suppose a case of using a first referential semiconductor device (hereinafter, a "semiconductor device 1R1") in which, unlike in the semiconductor device 1, two identical semiconductor chips are provided in the identical orientation. In this case, two structure units constituted by the respective sets of components including the respective semiconductor chips are substantially identical to each other, and they are located side by side. As such, a source terminal for the first semiconductor chip (which may correspond to the source terminal 17 of the semiconductor device 1), a gate terminal for the first semiconductor chip (which may correspond to the gate terminal 15 of the semiconductor device 1), a source terminal for the second semiconductor chip (which may correspond to the source terminal 27 of the semiconductor device 1), and a gate terminal for the second semiconductor chip (which may correspond to the gate terminal 25 of the semiconductor device 1) are arranged in this order. Thus, in order to employ the first referential semiconductor device 1R1 as a component having the circuit C11 and the circuit C12 in the apparatus 100, the mutually nonadjacent two source terminals must be coupled to each other, and also the mutually nonadjacent two gate terminals must be coupled to each other. This will complicate the pattern layout for the printed circuit board 106 of the apparatus 100, and will hamper the downsizing of the apparatus 100 due to the need for a larger area occupation for the pattern layout.

As another option, a case of using a second referential semiconductor device (hereinafter, a "semiconductor device 1R2") in which two identical semiconductor chips are provided in opposite orientations, could be considered. In this case, gate terminals of the two semiconductor chips (which correspond to the gate terminals 15 and 25 of the semiconductor device 1) are located apart from each other at opposite portions of the semiconductor device 1R2. Likewise, source terminals of the two semiconductor chips (which correspond to the source terminals 17 and 27 of the semiconductor device 1) are located apart from each other at opposite portions of the semiconductor device 1R2. Thus, in order to employ the second referential semiconductor device 1R2 as a component having the circuit C11 and the circuit C12 in the apparatus 100, the oppositely located two terminals must be coupled to each other. This will require additional works such as fabrication of overhead conductors above the semiconductor device 1R2, and will make the implementation difficult.

According to the first embodiment, a semiconductor device 1 includes a semiconductor chip 11 including a transistor Tr1 and a diode D1 which are coupled in parallel to each other, and a semiconductor chip 21 including a transistor Tr2 and a diode D2 which are coupled in parallel to each other. The semiconductor device 1 utilizes the form of couplings where the sources of the transistors Tr1 and Tr2 are electrically coupled to each other outside and also the gates of the transistors Tr1 and Tr2 are electrically coupled to each other outside. This enables the semiconductor device 1 to provide a switching function between the drains of the transistors Tr1 and Tr2, as well as a function of suppressing or inhibiting the occurrence of a reverse current opposite to the current in an intended direction.

Moreover, according to the first embodiment, the semiconductor device 1 further includes lead frames 10 and 20, source terminals 17 and 27, and the gate terminals 15 and 25. The semiconductor chips 11 and 21 are identical semiconductor chips, and therefore, the shapes of the gate electrode 111 and the source electrode 112 and their positions with respect to the semiconductor chip 11 conform to, or substantially conform to, the shapes of the gate electrode 211 and the source electrode 212 and their positions with respect to the semiconductor chip 21, respectively. With such sameness, the semiconductor chip 21 is arranged in an orientation turned by 90° from the orientation of the semiconductor chip 11. Accordingly, the gate electrode 111 and the gate electrode 211 are arranged next to each other along the x axis, without having the source electrode 112 or 212 intervening therebetween. This permits the gate terminal 15, which is coupled to the gate electrode 111 via the interconnect 16, and the gate terminal 25, which is coupled to the gate electrode 211 via the interconnect 26, to be disposed in the same part of the semiconductor device 1 (in the example shown in FIG. 2, the lower part). Likewise, the source terminals 17 and 27 are permitted to be disposed in the same part of the semiconductor device 1 (in the example shown in FIG. 2, the lower part). Therefore, as discussed above with reference to FIG. 12, the coupling between the gate terminals 15 and 25 and the coupling between the source terminals 17 and 27 are easily formed outside the semiconductor device 1 to fulfill the purpose of providing the switching function and the reverse current prevention function by the semiconductor device 1.

Also according to the first embodiment, the source terminals 17 and 27 are located at outer positions as viewed from the set of the gate terminals 15 and 25. In other words, the gate terminals 15 and 25 are located farther from the ends of the semiconductor device 1 than the source terminals 17 and 27. Generally, terminals for external connection, located at the ends of a semiconductor device easily become vulnerable to damage according to their use and/or with time. The gate terminals 15 and 25 are located away from the ends of the semiconductor device 1, and therefore, they are not easily damaged. Instead, the source terminals 17 and 27, located at the ends, are more exposed to damage. Still, the source terminals 17 and 27 use larger areas than the gate terminals 15 and 25, which means that the source terminals 17 and 27 are more robust to damage than the gate terminals 15 and 25. Therefore, the product (the semiconductor device 1) including the source terminals 17 and 27 at the ends is realized with a reduced risk of damage.

While certain embodiments have been described, they have been presented by way of example only, and are not intended to limit the scope of the inventions. Indeed, the novel embodiments described herein may be embodied in a variety of other forms. Furthermore, various omissions, substitutions, and changes in the form of the embodiments may be made without departing from the spirit of the inventions. The accompanying claims and their equivalents are intended to cover such forms or modifications as would fall within the scope and spirit of the inventions.

What is claimed is:
1. A semiconductor device comprising:
a first lead frame;
a first semiconductor chip in contact with the first lead frame, the first semiconductor chip including a first transistor, the first semiconductor chip including a first gate electrode and a first source electrode on a surface of the first semiconductor chip opposite to the first lead frame, the first gate electrode coupled to a gate of the first transistor, the first source electrode coupled to a source of the first transistor;
a first source terminal located in a first direction from the first lead frame and separated from the first semiconductor chip;
a first gate terminal located in a second direction from the first source terminal, electrically coupled to the first gate electrode, and separated from the first semiconductor chip, the second direction being perpendicular to the first direction;

a first conductor in contact with the first source electrode via a conductor and in contact with the first source terminal via a conductor;
a second lead frame located in the second direction from the first lead frame;
a second semiconductor chip in contact with the second lead frame, the second semiconductor chip including a second transistor, the second semiconductor chip including a second gate electrode and a second source electrode on a surface of the second semiconductor chip opposite to the second lead frame, the second gate electrode coupled to a gate of the second transistor, the second source electrode coupled to a source of the second transistor;
a second gate terminal located in the second direction from the first gate terminal, electrically coupled to the second gate electrode, and separated from the second semiconductor chip;
a second source terminal located in the second direction from the second gate terminal and separated from the second semiconductor chip; and
a second conductor in contact with the second source electrode via a conductor and in contact with the second source terminal via a conductor.
2. The semiconductor device according to claim 1, wherein
the first source electrode includes a first portion and a second portion connected to the first portion, the first portion located in a third direction from the first gate electrode, the third direction being opposite to the first direction, the second portion located in a fourth direction from the first gate electrode, the fourth direction being opposite to the second direction, and
the second source electrode includes a third portion and a fourth portion connected to the third portion, the third portion located in the third direction from the second gate electrode, the fourth portion located in the second direction from the second gate electrode.
3. The semiconductor device according to claim 2, wherein
the first semiconductor chip includes a first side, a second side which is more in the second direction than the first side, and a third side facing the first source terminal, the first gate electrode facing the second side and the third side, and
the second semiconductor chip includes a fourth side, a fifth side which is more in the second direction than the fourth side, and a sixth side facing the second source terminal, the second gate electrode facing the fourth side and the sixth side.
4. The semiconductor device according to claim 3, wherein
the first semiconductor chip further includes a first diode including a first anode and a first cathode, the first anode coupled to the source of the first transistor, the first cathode coupled to a drain of the first transistor, and
the second semiconductor chip further includes a second diode including a second anode and a second cathode, the second anode coupled to the source of the second transistor, the second cathode coupled to a drain of the second transistor.
5. The semiconductor device according to claim 4, wherein the first lead frame includes a fifth portion and a sixth portion, the sixth portion located in the second direction from the fifth portion and connected to the fifth portion, the sixth portion and the second lead frame being next to each other, the sixth portion being more in a fifth direction than the fifth portion, the fifth direction being a direction toward the first semiconductor chip from the first lead frame.

6. The semiconductor device according to claim 5, wherein a shape of the first semiconductor chip conforms to a shape of the second semiconductor chip, a shape of the first gate electrode and a location of the first gate electrode with respect to the first semiconductor chip conform to a shape of the second gate electrode and a location of the second gate electrode with respect to the second semiconductor chip, and a shape of the first source electrode and a location of the first source electrode with respect to the first semiconductor chip conform to a shape of the second source electrode and a location of the second source electrode with respect to the second semiconductor chip.

7. The semiconductor device according to claim 6, further comprising a resin covering a whole or a part of each of the first lead frame, the first semiconductor chip, the first source terminal, the first gate terminal, the first conductor, the second lead frame, the second semiconductor chip, the second gate terminal, the second source terminal, and the second conductor, wherein the first lead frame and the second lead frame are each partially exposed from the resin toward the third direction, and the first source terminal, the first gate terminal, the second gate terminal, and the second source terminal are each partially exposed from the resin toward the first direction.

8. The semiconductor device according to claim 7, wherein the first conductor includes a seventh portion and an eighth portion connected to the seventh portion, the seventh portion located in the fifth direction from the first portion and in the third direction from the first gate electrode, the eighth portion located in the fifth direction from the second portion and in the fourth direction from the first gate electrode, and the second conductor includes a ninth portion and a tenth portion connected to the ninth portion, the ninth portion located in the fifth direction from the third portion and in the third direction from the second gate electrode, the tenth portion located in the fifth direction from the fourth portion and in the second direction from the second gate electrode.

9. The semiconductor device according to claim 8, wherein the first conductor includes an eleventh portion and a twelfth portion, the eleventh portion located in the fifth direction from the first source terminal, the twelfth portion being more in the fifth direction than the seventh portion, the eighth portion, and the eleventh portion, and the second conductor includes a thirteenth portion and a fourteenth portion, the thirteenth portion located in the fifth direction from the second source terminal, the fourteenth portion being more in the fifth direction than the ninth portion, the tenth portion, and the thirteenth portion.

10. The semiconductor device according to claim 9, wherein the first source terminal includes a fifteenth portion and a sixteenth portion, the eleventh portion located in the fifth direction from the sixteenth portion, the sixteenth portion being more in the fifth direction than the fifteenth portion, and the second source terminal includes a seventeenth portion and an eighteenth portion, the thirteenth portion located in the fifth direction from the eighteenth portion, the eighteenth portion being more in the fifth direction than the seventeenth portion.

11. The semiconductor device according to claim 2, wherein the first conductor includes a seventh portion and an eighth portion connected to the seventh portion, the seventh portion located in a fifth direction from the first portion and in the third direction from the first gate electrode, the eighth portion located in the fifth direction from the second portion and in the fourth direction from the first gate electrode, the fifth direction being a direction toward the first semiconductor chip from the first lead frame, and the second conductor includes a ninth portion and a tenth portion connected to the ninth portion, the ninth portion located in the fifth direction from the third portion and in the third direction from the second gate electrode, the tenth portion located in the fifth direction from the fourth portion and in the second direction from the second gate electrode.

12. The semiconductor device according to claim 11, wherein the first conductor includes an eleventh portion and a twelfth portion, the eleventh portion located in the fifth direction from the first source terminal, the twelfth portion being more in the fifth direction than the seventh portion, the eighth portion, and the eleventh portion, and the second conductor includes a thirteenth portion and a fourteenth portion, the thirteenth portion located in the fifth direction from the second source terminal, the fourteenth portion being more in the fifth direction than the ninth portion, the tenth portion, and the thirteenth portion.

13. The semiconductor device according to claim 1, wherein the first semiconductor chip includes a first side, a second side which is more in the second direction than the first side, and a third side facing the first source terminal, the first gate electrode facing the second side and the third side, and the second semiconductor chip includes a fourth side, a fifth side which is more in the second direction than the fourth side, and a sixth side facing the second source terminal, the second gate electrode facing the fourth side and the sixth side.

14. The semiconductor device according to claim 1, wherein the first semiconductor chip further includes a first diode including a first anode and a first cathode, the first anode coupled to the source of the first transistor, the first cathode coupled to a drain of the first transistor, and the second semiconductor chip further includes a second diode including a second anode and a second cathode, the second anode coupled to the source of the second transistor, the second cathode coupled to a drain of the second transistor.

15. The semiconductor device according to claim 1, wherein the first lead frame includes a fifth portion and a sixth portion, the sixth portion located in the second direction from the fifth portion and connected to the fifth portion, the sixth portion and the second lead frame being next to each other, the sixth portion being more in a fifth direction than the fifth portion, the fifth direction being a direction toward the first semiconductor chip from the first lead frame.

16. The semiconductor device according to claim 1, wherein a shape of the first semiconductor chip conforms to a shape of the second semiconductor chip, a shape of the first gate electrode and a location of the first gate electrode with respect to the first semiconductor chip conform to a shape of the second gate electrode and a location of the second gate electrode with respect to the second semiconductor chip, and a shape of the first source electrode and a location of the first source electrode with respect to the first semiconductor chip conform to a shape of the second source electrode and a location of the second source electrode with respect to the second semiconductor chip.

17. The semiconductor device according to claim 1, further comprising a resin covering a whole or a part of each of the first lead frame, the first semiconductor chip, the first source terminal, the first gate terminal, the first conductor, the second lead frame, the second semiconductor chip, the second gate terminal, the second source terminal, and the second conductor, wherein the first lead frame and the second lead frame are each partially exposed from the resin toward a third direction opposite to the first direction, and the first source terminal, the first gate terminal, the second gate terminal, and the second source terminal are each partially exposed from the resin toward the first direction.

18. The semiconductor device according to claim 1, wherein a shape of the first source terminal along a first plane which includes the first direction and the second direction does not overlap with a shape of the first semiconductor chip along the first plane, a shape of the first gate terminal along the first plane does not overlap with the shape of the first semiconductor chip along the first plane, a shape of the second source terminal along the first plane does not overlap with a shape of the second semiconductor chip along the first plane, and a shape of the second gate terminal along the first plane does not overlap with the shape of the second semiconductor chip along the first plane.

* * * * *